(12) United States Patent
Yamazaki et al.

(10) Patent No.: US 8,063,808 B2
(45) Date of Patent: Nov. 22, 2011

(54) MULTI-INPUT OPERATIONAL AMPLIFIER CIRCUIT, DIGITAL/ANALOG CONVERTER USING SAME, AND DRIVER FOR DISPLAY DEVICE USING SAME

(75) Inventors: Koji Yamazaki, Ibaraki (JP); Koji Higuchi, Ibaraki (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 12/206,189

(22) Filed: Sep. 8, 2008

(65) Prior Publication Data
US 2009/0085788 A1    Apr. 2, 2009

(30) Foreign Application Priority Data
Sep. 27, 2007   (JP) .................... 2007-252781

(51) Int. Cl.
   *H03M 1/68* (2006.01)
(52) U.S. Cl. ............... 341/145; 341/136; 345/690
(58) Field of Classification Search ........... 330/147, 330/255; 341/136, 144, 145, 153, 154; 345/94, 345/95, 204, 690–693
See application file for complete search history.

(56) References Cited

U.S. PATENT DOCUMENTS

| | | | |
|---|---|---|---|
| 5,731,774 A | 3/1998 | Fujii et al. | |
| 6,373,419 B1 | 4/2002 | Nakao | |
| 6,448,916 B1 * | 9/2002 | Leung | 341/144 |
| 7,375,670 B1 * | 5/2008 | Wang et al. | 341/145 |
| 7,495,512 B2 * | 2/2009 | Tsuchi | 330/260 |
| 7,511,694 B2 * | 3/2009 | Kim et al. | 345/98 |
| 7,545,305 B2 * | 6/2009 | Tsuchi | 341/144 |
| 7,551,111 B2 * | 6/2009 | Shimatani | 341/144 |
| 7,595,776 B2 * | 9/2009 | Hashimoto et al. | 345/690 |
| 7,847,718 B2 * | 12/2010 | Ishii et al. | 341/145 |

FOREIGN PATENT DOCUMENTS

| | | |
|---|---|---|
| JP | 09-064746 | 3/1997 |
| JP | 2000-183747 | 6/2000 |

* cited by examiner

*Primary Examiner* — Howard Williams
(74) *Attorney, Agent, or Firm* — Taft Stettinius & Hollister LLP

(57) ABSTRACT

A multi-input operational amplifier circuit operable with a high degree of accuracy and in a small area, a D/A converter using the multi-input operational amplifier circuit, and a drive circuit or driver for a display device, using the D/A converter. In embodiments of the multi-input operational amplifier circuit, a constant current source of a third differential amplifier circuit that causes a doubled constant current i×2 to flow with respect to constant current sources of first and second differential amplifier circuits by application of two types of bias voltages thereto is configured using PMOS of the same number and size. Therefore, operations equivalent to those of a conventional circuit may be realized by the three constant current source PMOSs, and a smaller chip size may be required.

9 Claims, 9 Drawing Sheets

MULTI-INPUT OPERATIONAL AMPLIFIER CIRCUIT, DIGITAL/ANALOG CONVERTER USING SAME, AND DRIVER FOR DISPLAY DEVICE USING SAME

CROSS REFERENCE TO RELATED APPLICATION

This application claims priority under 35 U.S.C. §119 from Japanese Patent Application No. 2007-252781, filed on Sep. 27, 2007, which is incorporated by reference.

BACKGROUND OF THE INVENTION

The present invention relates to a multi-input operational amplifier circuit and, in particular, to a multi-input operational amplifier circuit that may be used, for example, in a driver or the like for a liquid crystal display device (liquid crystal hereinafter called "LC" and liquid crystal display device hereinafter called "LCD"), a digital/analog converter (hereinafter called "D/A converter") using the multi-input operational amplifier circuit, and a drive circuit or driver for a display device using the D/A converter.

A D/A converter using a multi-input operational amplifier circuit having differential amplifier circuits corresponding to the number of inputs has heretofore been generally adopted for, for example, an LCD source driver or the like as described in Japanese Unexamined Patent Publication No. Hei 9(1997)-64746 and Japanese Unexamined Patent Publication No. 2000-183747 (both of which are incorporated by reference) in order to realize a multi-gradation output without increasing a pattern area.

As described in, for example, Japanese Unexamined Patent Publication No. 2000-183747, the D/A converter used in the LCD source driver converts display data comprised of a digital signal to an analog voltage for gradation display or representation and supplies the analog voltage to a source signal line. A scan signal is supplied from a gate driver to a gate signal line and a display by each LC display element provided at a point where the gate signal line and the source signal line intersect.

The D/A converter comprises a reference voltage generating circuit or generator which generates a plurality of reference voltages, a selection circuit or selector which selects one of the reference voltages based on display data comprised of a digital signal of n bits (n=2, for example) and outputs first and second input signals, and a multi-input operational amplifier circuit comprised of a voltage follower circuit of 2 bit decoders, which converts each of the first and second input voltages to an analog voltage and supplies the same to the corresponding source signal line.

The multi-input operational amplifier circuit comprises an output terminal for outputting an output voltage corresponding to the result of operational amplification, first and second differential amplifier circuits, a load circuit, an output transistor, and an output-side current source.

Each of the first and second differential amplifier circuits comprises a constant current source and first and second input transistors that form a differential pair. The constant current source is connected between a power or source node and a common node, and inputs a bias voltage therein and supplies a constant current generated based on the bias voltage to the common node. The first input transistor is connected between the common node and a first output node, and inputs one of the first and input voltages selected by the selector therein and holds a conduction state controlled by this input voltage. The second input transistor is connected between the common node and a second output node, and inputs a voltage outputted from the output terminal therein and holds a conduction state controlled by the output voltage.

A load circuit is connected between the first and second output nodes and the ground in the first and second differential amplifier circuits. The load circuit converts a current obtained by adding currents flowing through the first output node in the first and second differential amplifier circuits to a control voltage. Further, the output transistor is connected between the output terminal and the ground. The output-side current source for supplying an operating current to the output transistor is connected between the source node and the output terminal. The output transistor holds a conduction state controlled by the control voltage converted by the load circuit and outputs an output voltage comprised of an average value of the first and second input voltages from the output terminal.

A problem, however, arises in that when the multi-input operational amplifier circuit used in the conventional D/A converter takes n bit decoders. Inter multi-input voltages (i.e., N input voltages) are uniformly divided into a number equal to the Nth power of 2, and the average value of the N input voltages is outputted as an output voltage, thus making it necessary to provide a number transistors equal to the Nth power of 2 for each differential pair and constant current source, thereby causing an increase in required chip area.

INTRODUCTION TO THE INVENTION

In a first aspect, a multi-input operational amplifier circuit according to the present invention may include an output terminal for outputting an average value of a plurality of voltages inputted thereto, as an output voltage; a first source node; a second source node; a first plurality of differential amplifier circuits, each of the differential amplifier circuits of the first plurality of differential amplifier circuits including a constant current source connected between the first source node and a common node, the constant current source adapted to receive a predetermined weighted bias voltage and supply a constant current to the common node based on the bias voltage, a first input transistor connected between the common node and a first output node, the first input transistor adapted to receive one of the input voltages, a conduction state of the first input transistor being controlled by the one of the input voltages, and a second input transistor connected between the common node and a second output node, the second input transistor adapted to receive the output voltage, a conduction state of the second input transistor being controlled by the output voltage; a first load circuit connected between the first and second output nodes and a second source node, the first load circuit being adapted to convert a current obtained by adding currents flowing into the first output node to a first control voltage; and a first output transistor connected between the second source node and the output terminal, a conduction state of the first output transistor being controlled by the first control voltage.

In a detailed embodiment of the first aspect, the circuit may include a second plurality of differential amplifier circuits, each of the differential amplifier circuits of the second plurality of differential amplifier circuits including a constant current source connected between the second source node and a common node, the constant current source adapted to receive a predetermined weighted bias voltage and supply a constant current to the common node based on the bias voltage, a first input transistor connected between the common node and a third output node, the first input transistor adapted to receive one of the input voltages, a conduction state of the first input transistor being controlled by the one of the input voltages, and a second input transistor connected between the common node and a fourth output node, the second input transistor adapted to receive the output voltage, a conduction state of the second input transistor being controlled by the output voltage; a second load circuit connected between the third and fourth output nodes and the first source node, the second load circuit being adapted to convert a current obtained by adding currents flowing into the third output node to a second control voltage; and a second output transistor connected between the first source node and the output terminal, a conduction state of the second transistor being controlled by a second control voltage converted by the second load circuit, and the multi-input operational amplifier may have a rail-to-rail configuration.

In a second aspect, a multi-input operational amplifier circuit according to the present invention may include an output terminal adapted to output an average value of a second input voltage and N−1 third inputs, where N is an integer greater than or equal to 2, the average value being supplied to the output terminal as an output voltage; a first differential amplifier circuit including a first constant current source connected between a first source node and a first common node, the first constant current source being adapted to receive a first bias voltage and supply a first constant current to the first common node based on the first bias voltage, a first input transistor connected between the first common node and a first output node, the first input transistor adapted to receive a first input voltage, a conduction state of the first input transistor being controlled by the first input voltage, and a second input transistor connected between the first common node and a second output node, the second input transistor being adapted to receive the output voltage, a conduction state of the second input transistor being controlled by the output voltage; a second differential amplifier circuit including a second constant current source connected between the first source node and a second common node, the second constant current source being adapted to receive the first bias voltage and supply a second constant current to the second common node based on the first bias voltage, a third input transistor connected between the second common node and the first output node, the third input transistor being adapted to receive the second input voltage, a conduction state of the third input transistor being controlled by the second input voltage, and a fourth input transistor connected between the second common node and the second output node, the fourth input transistor adapted to receive the output voltage, a conduction state of the forth input transistor being controlled by the output voltage; N−1 third differential amplifier circuits, each of the third differential amplifier circuits including a third constant current source connected between the first source node and a third common node, the third constant current source being adapted to receive a second bias voltage obtained by assigning a weight to the first bias voltage and supply a third constant current to the third common node based on the second bias voltage, a fifth input transistor connected between the third common node and the first output node, the fifth input transistor being adapted to receive a third input voltage therein, a conduction state of the fifth input transistor being controlled by the third input voltage, and a sixth input transistor connected between the third common node and the second output node, the sixth input transistor being adapted to receive the output voltage, a conduction state of the sixth input transistor being controlled by the output voltage; a first load circuit connected between the first and second output nodes and a second source node; and a first output transistor connected between the second source node and the output terminal, a conduction of the first output transistor state being controlled by a voltage on the first output node.

In a detailed embodiment of the second aspect, the circuit may include a fourth differential amplifier circuit including a fourth constant current source connected between a second source node and a fourth common node, the fourth constant current source adapted to receive a third bias voltage and supply a fourth constant current to the fourth common node based on the fourth bias voltage, a seventh input transistor connected between the fourth common node and a third output node, the fourth input transistor adapted to receive the first input voltage, a conduction state of the fourth input transistor being controlled by the first input voltage, and an eighth input transistor connected between the fourth common node and a fourth output node, the second input transistor being adapted to receive the output voltage, a conduction state of the eighth input transistor being controlled by the output voltage; a fifth differential amplifier circuit including a fifth constant current source connected between the second source node and a fifth common node, the fifth constant current source adapted to receive the fourth bias voltage and supply a second constant current to the second common node based on the fourth bias voltage, a ninth input transistor connected between the fifth common node and the third output node, the ninth input transistor being adapted to receive the second input voltage, a conduction state of the ninth input transistor being controlled by the second input voltage, and a tenth input transistor connected between the fifth common node and the fourth output node, the tenth input transistor adapted to receive the output voltage, a conduction state of the tenth input transistor being controlled by the output voltage; N−1 sixth differential amplifier circuits, each of the sixth differential amplifier circuits including a sixth constant current source connected between the second source node and a sixth common node, the sixth constant current source being adapted to receive a fourth bias voltage obtained by assigning a weight to the third bias voltage and supply a sixth constant current to the sixth common node based on the fourth bias voltage, an eleventh input transistor connected between the sixth common node and the third output node, the eleventh input transistor being adapted to receive the third input voltage therein, a conduction state of the fifth input transistor being controlled by the third input voltage, and a twelfth input transistor connected between the sixth common node and the fourth output node, the twelfth input transistor being adapted to receive the output voltage, a conduction state of the twelfth input transistor being controlled by the output voltage; a second load circuit connected between the third and fourth output nodes and the first source node; and a second output transistor connected between the first source node and the output terminal, a conduction state of the second output transistor being controlled by a voltage on the third output node, and the multi-input operational amplifier circuit may have a rail-to-rail configuration.

In a third aspect, a digital/analog converter according to the present invention may include a reference voltage generator adapted to generate a plurality of reference voltages; a selector adapted to receive the reference voltages and select a plurality of input voltages from the reference voltages, based on digital data including a plurality of bits; and a first multi-input operational amplifier circuit including an output terminal for outputting an average value of a plurality of voltages inputted thereto, as an output voltage; a first source node; a second source node; a first plurality of differential amplifier circuits, each of the differential amplifier circuits of the first plurality of differential amplifier circuits including a constant current source connected between the first source node and a common node, the constant current source adapted to receive a predetermined weighted bias voltage and supply a constant current to the common node based on the bias voltage, a first input transistor connected between the common node and a first output node, the first input transistor adapted to receive one of the input voltages, a conduction state of the first input transistor being controlled by the one of the input voltages, and a second input transistor connected between the common node and the second output node, the second input transistor adapted to receive the output voltage, a conduction state of the second input transistor being controlled by the output voltage; a first load circuit connected between the first and second output nodes and a second source node, the first load circuit being adapted to convert a current obtained by adding currents flowing into the first output node to a first control voltage; and an first output transistor connected between the second source node and the output terminal, a conduction state of the first output transistor being controlled by the first control voltage.

In a detailed embodiment of the third aspect, the converter may include a second plurality of differential amplifier circuits, each of the differential amplifier circuits of the second plurality of differential amplifier circuits including a constant current source connected between the first source node and a common node, the constant current source adapted to receive a predetermined weighted bias voltage and supply a constant current to the common node based on the bias voltage, a first input transistor connected between the common node and a third output node, the first input transistor adapted to receive one of the input voltages, a conduction state of the first input transistor being controlled by the one of the input voltages, and a second input transistor connected between the common node and a fourth output node, the second input transistor adapted to receive the output voltage, a conduction state of the second input transistor being controlled by the output voltage; a second load circuit connected between the third and fourth output nodes and the first source node, the second load circuit being adapted to convert a current obtained by adding currents flowing into the third output node to a second control voltage; and a second output transistor connected between the first source node and the output terminal, a conduction state of the second transistor being controlled by a second control voltage converted by the second load circuit, and the multi-input operational amplifier may have a rail-to-rail type configuration.

In a fourth aspect, a digital/analog converter according to the present invention may include a reference voltage generator which generates a plurality of reference voltages; a selector adapted to receive the reference voltages and select a first input voltage, a second input voltage, and N−1 third input voltages, where N is an integer greater than or equal to 2, based on digital data including a plurality of bits; and a multi-input operational amplifier circuit including an output terminal adapted to output an average value of a second input voltage and N−1 third input, the average value being supplied to the output terminal as an output voltage; a first differential amplifier circuit including a first constant current source connected between a first source node and a first common node, the first constant current source adapted to receive a first bias voltage and supply a first constant current to the first common node based on the first bias voltage, a first input transistor connected between the first common node and a first output node, the first input transistor adapted to receive a first input voltage, a conduction state of the first input transistor being controlled by the first input voltage, and a second input transistor connected between the first common node and a second output node, the second input transistor being adapted to receive the output voltage, a conduction state of the second input transistor being controlled by the output voltage; a second differential amplifier circuit including a second constant current source connected between the first source node and a second common node, the second constant current source adapted to receive the first bias voltage and supply a second constant current to the second common node based on the first bias voltage, a third input transistor connected between the second common node and the first output node, the third input transistor being adapted to receive the second input voltage, a conduction state of the third input transistor being controlled by the second input voltage, and a fourth input transistor connected between the second common node and the second output node, the fourth input transistor adapted to receive the output voltage, a conduction state of the forth input transistor being controlled by the output voltage; N−1 third differential amplifier circuits, each of the third differential amplifier circuits including a third constant current source connected between the first source node and a third common node, the third constant current source being adapted to receive a second bias voltage obtained by assigning a weight to the first bias voltage and supply a third constant current to the third common node based on the second bias voltage, a fifth input transistor connected between the third common node and the first output node, the fifth input transistor being adapted to receive a third input voltage therein, a conduction state of the fifth input transistor being controlled by the third input voltage, and a sixth input transistor connected between the third common node and the second output node, the sixth input transistor being adapted to receive the output voltage, a conduction state of the sixth input transistor being controlled by the output voltage; a first load circuit connected between the first and second output nodes and a second source node; and a first output transistor connected between the second source node and the output terminal, a conduction of the first output transistor state being controlled by a voltage on the first output node.

In a detailed embodiment of the fourth aspect, the converter may include a fourth differential amplifier circuit including a fourth constant current source connected between a second source node and a fourth common node, the fourth constant current source adapted to receive a third bias voltage and supply a fourth constant current to the fourth common node based on the fourth bias voltage, a seventh input transistor connected between the fourth common node and a third output node, the fourth input transistor adapted to receive the first input voltage, a conduction state of the fourth input transistor being controlled by the first input voltage, and an eighth input transistor connected between the fourth common node and a fourth output node, the second input transistor being adapted to receive the output voltage, a conduction state of the eighth input transistor being controlled by the output voltage; a fifth differential amplifier circuit including a fifth constant current source connected between the second source node and a fifth common node, the fifth constant current source adapted to receive the fourth bias voltage and supply a second constant current to the second common node based on the fourth bias voltage, a ninth input transistor connected between the fifth common node and the third output node, the ninth input transistor being adapted to receive the second input voltage, a conduction state of the ninth input transistor being controlled by the second input voltage, and a tenth input transistor connected between the fifth common node and the fourth output node, the tenth input transistor adapted to receive the output voltage, a conduction state of the tenth input transistor being controlled by the output voltage; N−1 sixth differential amplifier circuits, each of the sixth differential amplifier circuits including a sixth constant current source connected between the second source node and a sixth common node, the sixth constant current source being adapted to receive a fourth bias voltage obtained by assigning a weight to the third bias voltage and supply a sixth constant current to the sixth common node based on the fourth bias voltage, an eleventh input transistor connected between the sixth common node and the third output node, the eleventh input transistor being adapted to receive the third input voltage therein, a conduction state of the fifth input transistor being controlled by the third input voltage, and a twelfth input transistor connected between the sixth common node and the fourth output node, the twelfth input transistor being adapted to receive the output voltage, a conduction state of the twelfth input transistor being controlled by the output voltage; a second load circuit connected between the third and fourth output nodes and the first source node; and a second output transistor connected between the first source node and the output terminal, a conduction state of the second output transistor being controlled by a voltage on the third output node, and the multi-input operational amplifier circuit may have a rail-to-rail type configuration.

In a fifth aspect, a driver suitable for use in a display device including a digital/analog converter for converting digital data of m+n bits, where n is an integer greater than or equal to 3 and m is a positive integer, to analog data may include a reference voltage generator adapted to generate a plurality of gradation voltages corresponding to m bits; a first selection circuit adapted to select two of the gradation voltages from the reference voltage generator, based on the digital data of m bits; a second selection circuit adapted to output one of the two gradation voltages selected by the first selection circuit as analog data of respective n outputs, based on digital data of n bits; and a multi-input operational amplifier circuit adapted to receive the analog data, assign respective weights thereto according to the respective bits, and output an average value thereof.

In a detailed embodiment of the fifth aspect, the multi-input operational amplifier circuit may include a first differential amplifier circuit adapted to output a first voltage, based on a first constant current source based on a first bias voltage, and a first input voltage; a second differential amplifier circuit connected in parallel with the first differential amplifier circuit adapted to output a second voltage, based on the first constant current source based on the first bias voltage, and a second input voltage; a third differential amplifier circuit connected in parallel with the first differential amplifier circuit adapted to output a third voltage, based on a second constant current source based on a second bias voltage, and a third input voltage; and a fourth differential amplifier circuit connected in parallel with the first differential amplifier circuit adapted to output a fourth voltage, based on a third constant current source based on the second bias voltage, and a fourth input voltage. The first through fourth input voltages may correspond to one of the selected two gradation voltages, and the driver may output an average value of the first through fourth input voltages.

In another detailed embodiment of the fifth aspect, the multi-input operational amplifier circuit may include a first differential amplifier circuit adapted to output a first voltage, based on a first constant current source based on a first bias voltage, and a first input voltage; a second differential amplifier circuit connected in parallel with the first differential amplifier circuit adapted to output a second voltage, based on the first constant current source based on the first bias voltage, and a second input voltage; a third differential amplifier circuit connected in parallel with the first differential amplifier circuit adapted to output a third voltage, based on a second constant current source based on the first bias voltage, and a third input voltage; and a fourth differential amplifier circuit connected in parallel with the first differential amplifier circuit adapted to output a fourth voltage, based on a third constant current source based on a second bias voltage, and a fourth input voltage. The first through fourth input voltages may correspond to one of the selected two gradation voltages, and the driver may output an average value of the first through fourth input voltages.

In yet another detailed embodiment of the fifth aspect, the multi-input operational amplifier circuit may include a first differential amplifier circuit adapted to output a first voltage, based on a first constant current source based on a first bias voltage, and a first input voltage; an n+1th differential amplifier circuit connected in parallel with the first differential amplifier circuit adapted to output an n+1th voltage, based on a second constant current source based on a second bias voltage, and analog data corresponding to the most significant bit of lower n bits; and a differential amplifier circuit group comprising a plurality of differential amplifier circuits each of which is connected in parallel with the first differential amplifier circuit and includes a constant current source for outputting a current, different from an n+1th constant current source and each of which outputs each voltage, based on analog data corresponding to each of the lower n−1 bits. The voltages inputted to the respective differential amplifier circuits may correspond to one of the selected two gradation voltages, the driver may output an average value of the voltages outputted from the respective differential amplifier circuits, and n may be a positive integer.

The foregoing is a summary and thus contains, by necessity, simplifications, generalization, and omissions of detail; consequently, those skilled in the art will appreciate that the summary is illustrative only and is not intended to be in any way limiting. Other aspects, features, and advantages of the devices and/or processes and/or other subject matter described herein will become apparent in the teachings set forth herein.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE INVENTION

Figure 1:
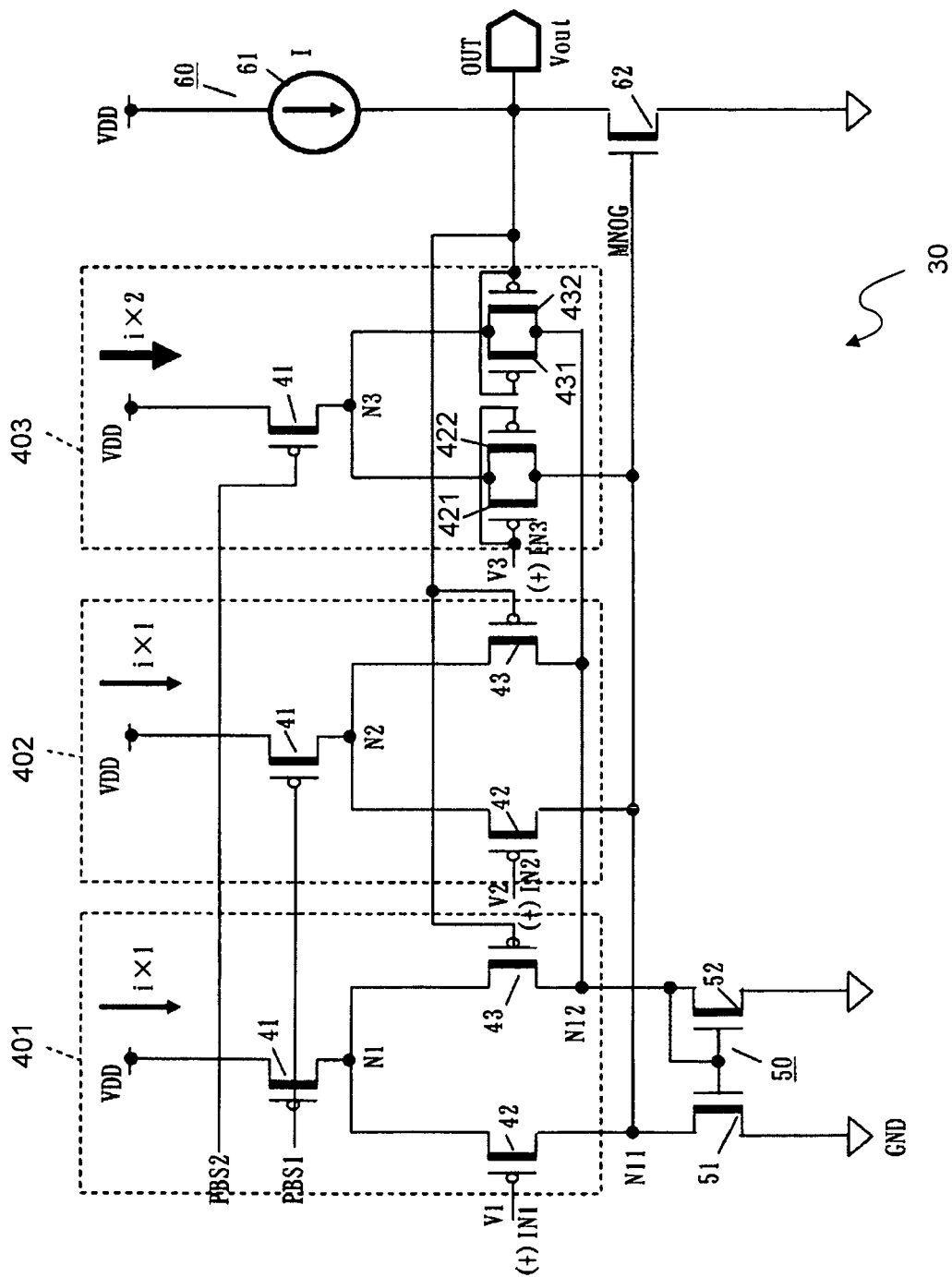
FIG. 1 is a schematic diagram of a first exemplary embodiment of at multi-input operational amplifier circuit according to the present invention.

The present invention relates to, for example, a multi-input operational amplifier circuit, a D/A converter and a driver for a display device, each of which aims to reduce the number of elemental devices, chip area, and cost when a display's multi-gradation or toning is determined at an LCD source driver or the like.

It is an object of the present invention to provide a multi-input operational amplifier circuit, a D/A converter, and a drive circuit or driver for a display device, which are operable with a high degree of accuracy and require a relatively small chip area. According to one aspect of the invention, for attaining the above object, there may be provided a multi-input operational amplifier circuit comprising an output terminal for outputting an average value of a plurality of voltages inputted thereto, as an output voltage, a plurality of differential amplifier circuits, a load circuit and an output transistor.

Each of the differential amplifier circuits may include a constant current source connected between a first source node and a common node and which supplies a predetermined weighted bias voltage and supplies a constant current generated based on the bias voltage to the common node, a first input transistor which is connected between the common node and a first output node and which receives one input voltage of the input voltages therein and holds a conduction state controlled by the one input voltage, and a second input transistor which is connected between the common node and a second output node and which receives the output voltage therein and holds a conduction state controlled by the output voltage. The load circuit may be connected between the first and second output nodes and a second source node in the differential amplifier circuits and may convert a current obtained by adding currents flowing into the first output node in the differential amplifier circuits to a control voltage. Further, the output transistor may be connected between the second source node and the output terminal and its conduction state may be controlled by the control voltage.

According to another aspect of the invention, for attaining the above object, there may be provided a D/A converter comprising a reference voltage generator which generates a plurality of reference voltages, a selector which inputs the reference voltages therein and selects a plurality of input voltages from the reference voltages, based on digital data of a plurality of bits, and the multi-input operational amplifier circuit described above, which receives the input voltages therein and outputs an average value of the input voltages as an output voltage.

According to another aspect of the invention, for attaining the above object, there may be provided a driver suitable for use in a display device, which is a D/A converter for converting digital data of m+n bits, where n is an integer greater than or equal to 3, to analog data, comprising a reference voltage generator which generates gradation voltages corresponding to m bits, a first selection circuit which selects the two gradation voltages from the reference voltage generator, based on digital data of m bits, a second selection circuit which outputs either of the two gradation voltages selected by the first selection circuit as analog data of respective n outputs, based on digital data of n bits, and a multi-input operational amplifier circuit which receives the n analog data therein and which assigns weights thereto according to the respective bits and outputs an average value thereof.

Accordingly, since the multi-input operational amplifier circuit may be provided with a plurality of constant current sources capable of causing different constant currents to flow while being identical in transistor size, for example, a smaller chip area may be required while operations equivalent to those of the related art are realized.

Using the multi-input operational amplifier circuit having such advantages may make it possible to provide a D/A converter and a drive circuit or driver for a display device which are operable with a high degree of accuracy and require only a small chip area.

An exemplary multi-input operational amplifier circuit may include an output terminal for outputting an average value of a second input voltage and (N−1) (where N: integer greater than or equal to 2) third input voltages, as an output voltage, a first differential amplifier circuit, a second differential amplifier circuit, (N−1) third differential amplifier circuits, a load circuit and an output transistor.

A first differential amplifier circuit may include a first constant current source which is connected between a first source node and a first common node and which inputs a first bias voltage therein and supplies a first constant current generated based on the first bias voltage to the first common node, a first input transistor which is connected between the first common node and a first output node and which inputs the first input voltage therein and holds a conduction state controlled by the first input voltage, and a second input transistor which is connected between the first common node and a second output node and which inputs the output voltage therein and holds a conduction state controlled by the output voltage.

A second differential amplifier circuit may include a second constant current source which is connected between the first source node and a second common node and which inputs the first bias voltage therein and supplies a second constant current generated based on the first bias voltage to the second common node, a third input transistor which is connected between the second common node and the first output node and which inputs the second input voltage therein and holds a conduction state controlled by the second input voltage, and a fourth input transistor which is connected between the second common node and the second output node and which inputs the output voltage therein and holds a conduction state controlled by the output voltage.

Each of the (N−1) third differential amplifier circuits may include a third constant current source which is connected between the first source node and a third common node and which inputs a second bias voltage obtained by assigning weights to the first bias voltage therein and supplies a third constant current generated based on the second bias voltage to the third common node, a fifth input transistor which is connected between the third common node and the first output node and which inputs the third input voltage therein and holds a conduction state controlled by the third input voltage, and a sixth input transistor which is connected between the third common node and the second output node and which inputs the output voltage therein and holds a conduction state controlled by the output voltage.

A load circuit may be connected between the first and second output nodes and a second source node. Further, the output transistor may be a transistor connected between the second source node and the output terminal and whose conduction state is controlled by a voltage on the first output node.

Detailed exemplary embodiments of the present invention will hereinafter be described with reference to the accompanying drawings.

First Exemplary Embodiment

Figure 2:
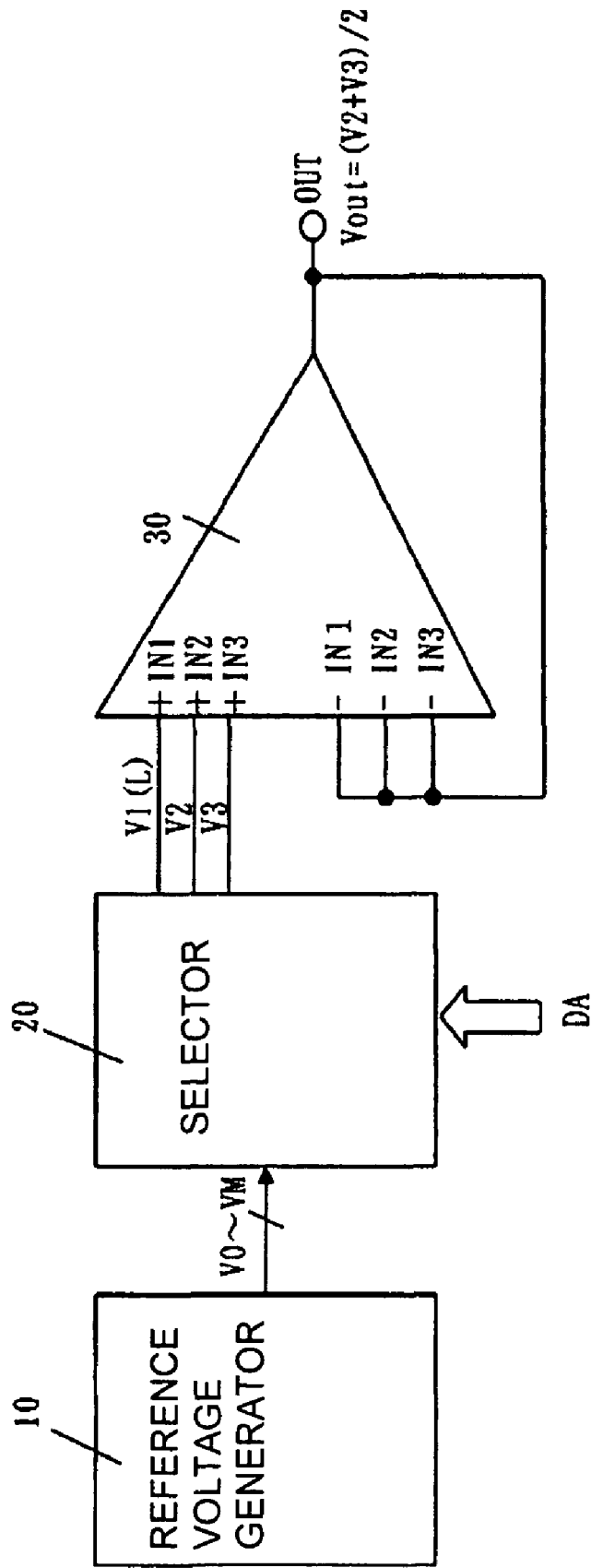
FIG. 2 is a schematic diagram of an exemplary D/A converter including the exemplary embodiment of FIG. 1.

An exemplary D/A converter shown in FIG. 2 may be used in an LCD source driver, for example, which may convert display data DA (comprising a digital signal) to an output voltage Vout corresponding to an analog display voltage. The D/A convertor may output voltage Vout to a source signal line. The D/A converter may include a reference voltage generating circuit or generator 10. The reference voltage generator 10 may be a circuit that generates a plurality of (M+1) reference voltages V0 through VM in accordance with the display data DA, where M may be a few hundred to few thousand, for example. A selection circuit or selector 20 may be connected to the output side of the reference voltage generator 10. The selector 20 may be a circuit that selects input voltages V1, V2 and V3 from the (M+1) reference voltages V0 through VM, based on the display data DA comprising the digital signal bits (D0, D1 and D2, for example) and outputs the same. The input voltages V1, V2 and V3 correspond to, for example, either of two adjacent reference voltages V1 through VM. A multi-input operational amplifier circuit 30 may be connected to the output side of the selector 20.

An exemplary multi-input operational amplifier circuit 30 may include a voltage follower circuit of n bit decoders (n=2 bits, for example), which has a positive-phase input terminal (+) IN1 to which an input voltage V1 fixed to "L" is inputted, positive-phase input terminals (+) IN2 and (+) IN3 to which input voltages V2 and V3 respectively changed to "H" or "L" are inputted, and negative-phase or antiphase input terminals thereof (−) IN1, (−) IN2 and (−) IN3. The negative-phase input terminals (−) IN1, (−) IN2 and (−) IN3 are respectively connected to an output terminal OUT. The multi-input operational amplifier circuit 30 may determine an average value (V2+V3)/2 (=Vout) of the two-bit input voltages V2 and V3, outputting the output voltage Vout corresponding to the analog display voltage from the output terminal OUT and supplying the same to the corresponding source signal line.

Figure 3A:
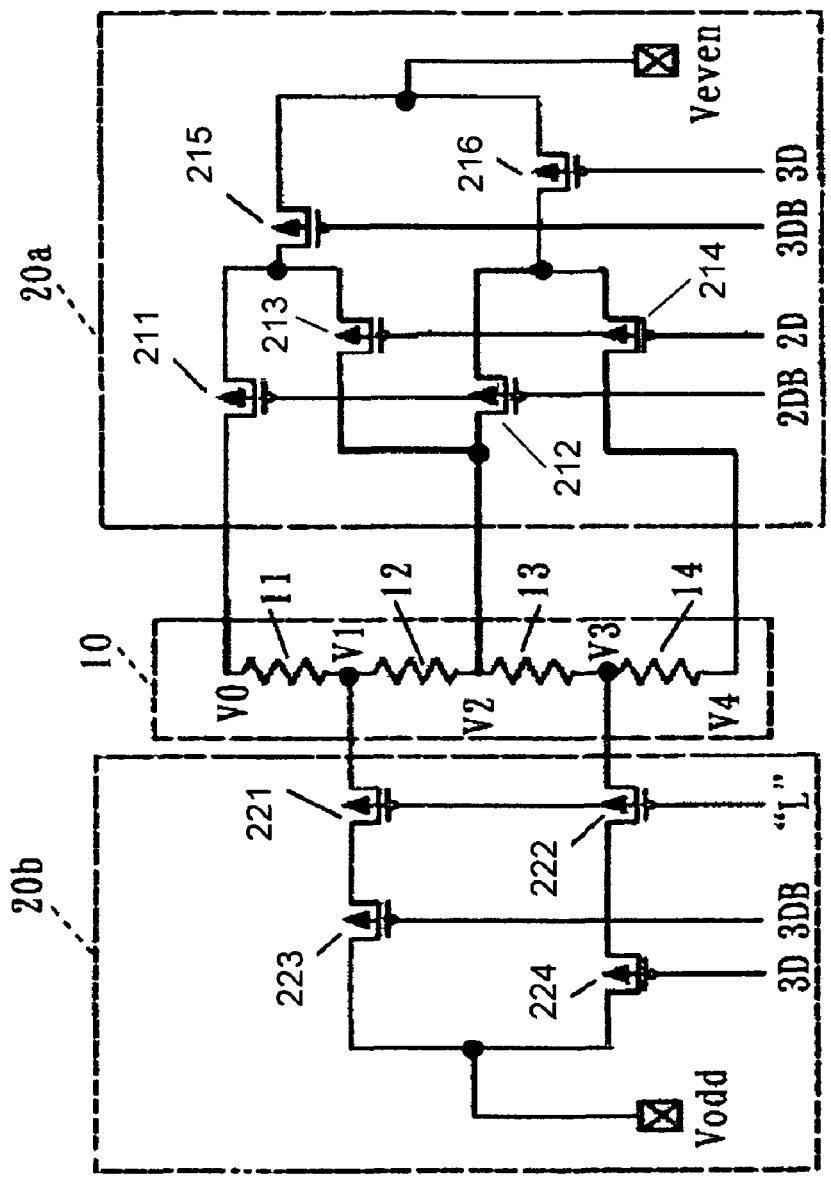
FIG. 3A is a detailed schematic diagram of the exemplary reference voltage generator shown in FIG. 2.
Figure 3B:
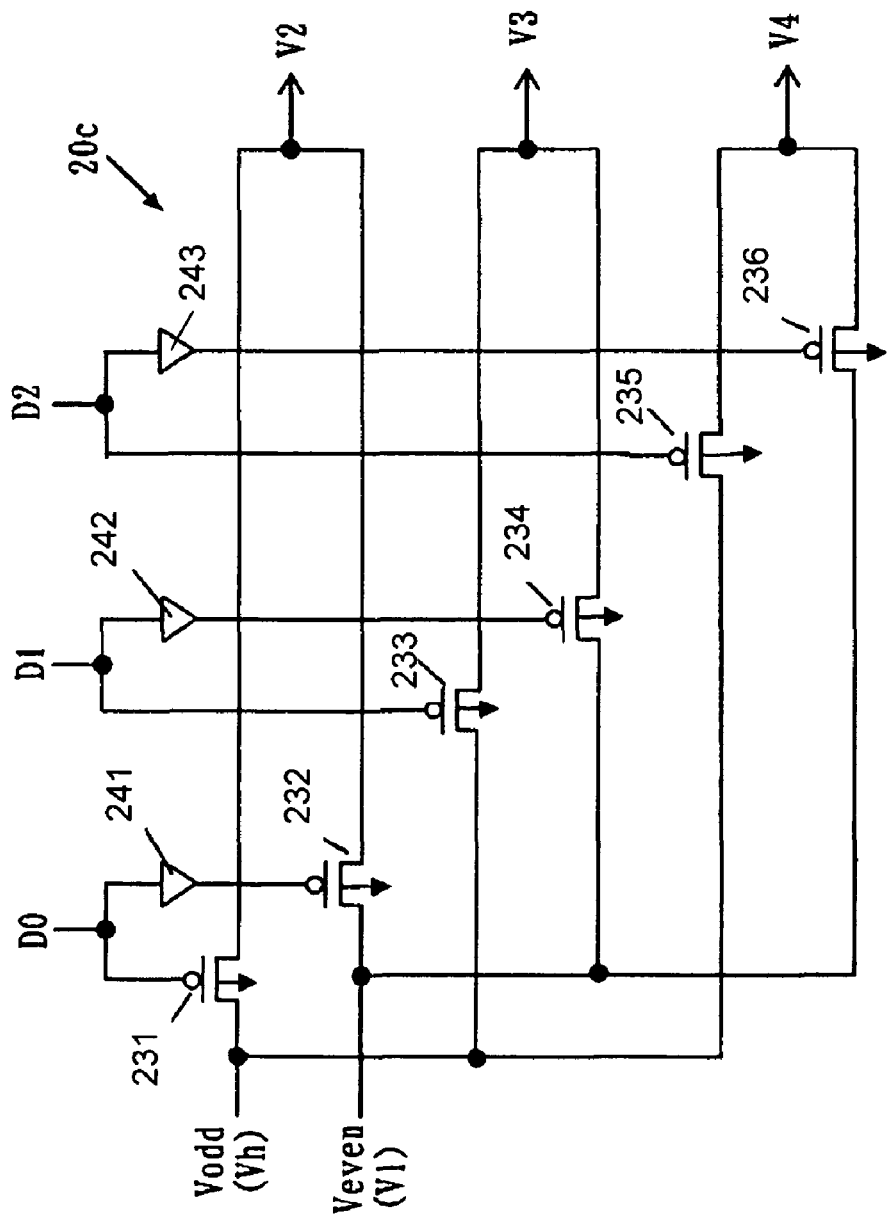
FIG. 3B is a detailed schematic diagram of the exemplary selector shown in FIG. 2.

Referring to FIGS. 3A and 3B, an exemplary reference voltage generator 10 may include a resistance division circuit having a plurality of resistive elements 11, 12, 13, 14, . . . and in which may be connected in series. Voltages V0, V1, V2, V3, V4, . . . are outputted from between the resistive elements or the like.

An exemplary selector 20 may include first selection circuits 20a and 20b connected to the output side of the reference voltage generator 10, and a second selection circuit 20c connected to the output sides of the first selection circuits 20a and 20b.

An exemplary first selection circuit 20a may include a plurality of switches (for example, P channel type MOS transistors, which are hereinafter called "PMOS") 211 through 216 which may be ON/OFF-operated by complementary data 2D, 3D, 2DB, and 3DB. The first selection circuit 20a may output a voltage Veven corresponding to an "L" potential Vl. The first selection circuit 20b may include a plurality of switches (for example, PMOS) 221 through 224 which may be ON/OFF-operated by complementary data 3D, 3DB, and fixed potential "L", and which may output a voltage Vodd corresponding to an "H" potential Vh. The second selection circuit 20c may include a plurality of switches (for example, PMOS) 231 through 236, and a plurality of inverters 241 through 243 which respectively invert bits D0, D1 and D2 that may comprise display data DA. The second selection circuit 20c may ON/OFF-operate the PMOS 231 through 236 by the bits D0, D1 and D2 and their inverted bits and outputs voltages V2, V3 and V4 from the voltages Veven and Vodd.

Referring to FIG. 1, a multi-input operational amplifier circuit 30 according to a first exemplary embodiment may include a voltage follower circuit of n bit (2 bit, for example) decoders. An exemplary multi-input operational amplifier circuit 30 may include a plurality of differential stages (first, second and third differential amplifier circuits, for example) 401 through 403, a load circuit 50 connected in common to the first, second and third differential amplifier circuits 401 through 403, and an output stage (output circuit, for example) 60 connected to the differential amplifier circuits 401 through 403 and load circuit 50.

Of the first, second, and third differential amplifier circuits 401 through 403, the first differential amplifier circuit 401 may include a positive-phase input terminal (+) IN1 to which a first input voltage (fixed "L", for example) is inputted, a first common node N1 which causes a current i×1 (i=1 mA, for example) to flow therethrough, a first output node N11 which outputs a control voltage MNOG, and a second output node N12 complementary to the first output node N11. The first common node N1 may be connected to a first source or power supply node (for example, VDD node to which a source voltage of 15V is applied) via a first constant current source which supplies the constant current i×1. The first constant current source may include a PMOS 41 and may cause the constant current i×1 to flow between the source and drain thereof in response to a first bias voltage PBS1 (14V, for example) applied to the gate of the PMOS 41.

A first input transistor (for example, a PMOS) 42 and a second input transistor (for example, a PMOS) 43 that form a differential pair may be branch-connected to the first common node N1. Further, the PMOS 42 may be connected to the first output node N11 and the PMOS 43 may be connected to the second output node N12. The PMOS 42 may always be in an ON state due to the "L"-fixed input voltage V1 inputted to its gate from the positive-phase input terminal (+) IN1. The PMOS 43 may hold a conduction state controlled by an output voltage Vout inputted to its gate from an output terminal OUT.

The second differential amplifier circuit 402 may have a positive-phase input terminal (+) IN2 to which a second input voltage V2 is inputted, and a second common node N2 which causes a constant current i×1 to flow therethrough. In a manner similar to the first differential amplifier circuit 401, the second differential amplifier circuit 402 may include a PMOS 41 for a constant current source and PMOSs 42 and 43 for a differential pair. For example, in the second differential amplifier circuit 402, the second common node N2 may be connected to its corresponding VDD node via the PMOS 41 which supplies the constant current i×1. The PMOS 41 may cause the constant current i×1 to flow between the source and drain thereof in response to the first bias voltage PBS1 applied to its gate. The PMOSs 42 and 43 that form the differential pair may be branch-connected to the second common node N2. Further, the PMOS 42 may be connected to the first output node N11 and the PMOS 43 may be connected to the second output node N12. The PMOS 42 may hold a conduction state controlled by the input voltage V2 inputted to its gate from the positive-phase input terminal (+) IN2. Further, the PMOS 43 may hold a conduction state controlled by the output voltage Vout inputted to its gate from the output terminal OUT.

The third differential amplifier circuit 403 may have a positive-phase input terminal (+) IN3 to which a third input voltage V3 is inputted and a third common node N3 that may cause a doubled constant current i×2 (2 mA, for example) to flow therethrough. The third differential amplifier circuit 403 may include a PMOS 41 for one constant current source similar to the first and second differential amplifier circuits 401 and 402, two parallel-connected PMOSs 421 and 422 for a differential pair, which may be different from the first and second differential amplifier circuits 401 and 402, and two PMOSs 431 and 432 connected in parallel in like manner. In the third differential amplifier circuit 40-3, the third common node N3 may be connected to its corresponding VDD node via the PMOS 41 which may supply the doubled constant current i×2. The PMOS 41 for the constant current source may cause the doubled constant current i×2 to flow between the source and drain thereof in response to a second bias voltage PBS2 (13.5V, for example) applied to its gate. The two parallel-connected PMOSs 421 and 422 and the two-parallel-connected PMOSs 431 and 432 for forming the differential pairs may be branch-connected to the third common node N3. Further, the PMOSs 421 and 422 may be connected to the first output node N11 and the PMOSs 431 and 432 may be connected to the second output node N12. Each of the PMOSs 421 and 422 may hold a conduction state controlled by the input voltage V3 inputted to its gate from the positive-phase input terminal (+) IN3. Further, each of the PMOSs 431 and 432 may hold a conduction state controlled by the output voltage Vout inputted to its gate from the output terminal OUT.

The load circuit 50 is connected between the first and second output nodes N11 and N12 and a second source or power supply node (ground GND of 0V, for example). The load circuit 50 may include a current mirror circuit using two transistors (for example, N channel type MOS transistors, which are hereinafter called "NMOS") 51 and 52. The load circuit 50 may have the function of converting the current flowing through the first output node N11 to its corresponding control voltage MNOG and outputting the same to the output circuit 60. The drain and source of the NMOS 51 may be connected to the first output node N11 and the ground GND, respectively. The drain and source of the NMOS 52 may be connected to the second output node N12 and the ground GND, respectively. The gate and drain of the NMOS 52 may be connected to the gate of the NMOS 51. The output circuit 60 may be connected to the first output node N11.

The output circuit 60 may have a constant current source 61 including of transistors or the like for supplying a constant current I, an output terminal OUT for outputting the output voltage Vout, and an output transistor (for example, NMOS) 62. These components may be connected between the VDD node and the ground GND. The output terminal OUT may be connected in common to the gate of the PMOS 43 in the differential amplifier circuit 401, the gate of the PMOS 43 in the differential amplifier circuit 402, and the gates of the PMOSs 431 and 432 in the differential amplifier circuit 4-3. The NMOS 42 may be a transistor whose conduction state is controlled by the control voltage MNOG outputted from the first output node N11 and which outputs the amplified output voltage Vout from the output terminal OUT.

The multi-input operational amplifier circuit 30 of the first exemplary embodiment may have the feature that, as compared with a conventional circuit, the two types of bias voltages PBS1 and PBS2 for the constant current source are provided and the second bias voltage PBS2 may be brought to such a potential that causes the constant current i×2 to be twice as large as the current caused by the first bias voltage PBS1. In other words, the second bias voltage PBS2 may be lower than the first bias voltage PBS1. One example of a bias circuit for generating the first and second bias voltages PBS1 and PBS2 and bias voltages NBS1 and NBS2 complementary thereto is shown in FIG. 4.

Figure 4:
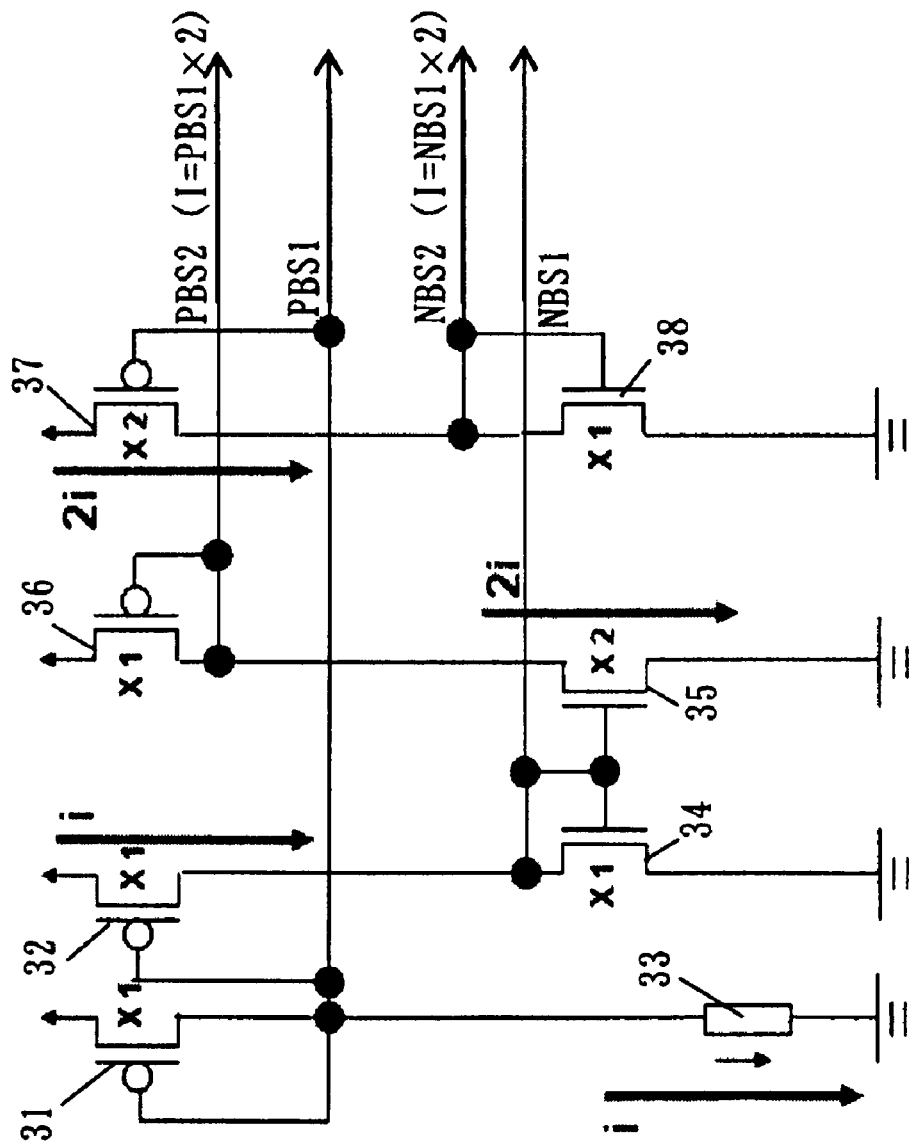
FIG. 4 is a schematic diagram of the exemplary bias circuit shown in FIG. 1.

Referring to FIG. 4, an exemplary bias circuit may include a plurality of PMOSs 31, 32, 36 and 37, a plurality of NMOSs 34, 35 and 38, and a load resistor 33 and may output complementary bias voltages PBS1, PBS2 and NBS1 and NBS2.

Referring to FIG. 2, (M+1) reference voltages V0 through VM may be generated by the reference voltage generator 10 in accordance with display data DA which may include a digital signal of bits and which may be supplied to the selector 20. The selector 20 may select a plurality of input voltages V1, V2 and V3 from the (M+1) reference voltages V0 through VM, based on the display data DA, and may output the same to the multi-input operational amplifier circuit 30. The multi-input operational amplifier circuit 30 may determine an average value (V2+V3)/2 (=Vout) of the two-bit input voltages V2 and V3, output an output voltage Vout corresponding to this analog display voltage from the output terminal OUT, and supply the same to a source signal line. At this time, a scan signal may be supplied from an gate driver to a gate signal line. Hence, a signal may be displayed by, for example, an LCD display element which is provided at a point where the gate signal line and the source signal line intersect.

Referring to FIG. 1, the first, second, and third input voltages V1, V2 and V3 outputted from the selector 20 may be respectively supplied to the positive-phase input terminals (+) IN1, (+) IN2 and (+) IN3 of the first, second and third differential amplifier circuits 401, 402 and 403. Further, the first bias voltage PBS1 may be supplied to the gate of the current source PMOS 41 lying in the first differential amplifier circuit 401 and the gate of the current source PMOS 41 lying in the second differential amplifier circuit 402. The second bias voltage PBS2 may be supplied to the gate of the current source PMOS 41 lying in the third differential amplifier circuit 403. In doing so, the current source PMOS 41 in the first differential amplifier circuit 40-1 may be activated and the input PMOS 42 thereof may be brought to an ON state. At the same time, the current source PMOS 41 in the second differential amplifier circuit 402 may be activated and the conduction state of the input PMOS 42 may be controlled by the input voltage V2. Further, in the third differential amplifier circuit 403, the current source PMOS 41 may be activated and the conduction states of the input PMOSs 421 and 422 may be controlled by the input voltage V3.

When current flows into the load circuit 50, it may be converted to a control voltage MNOG, which may appear on the first output node N11. The conduction state of the output NMOS 62 may be controlled by the control voltage MNOG, so that a constant current I may be supplied to the NMOS 62 from the constant current source 61. Thus, an output voltage Vout may appear at the output terminal OUT. In doing so, the conduction states of the input PMOS 43 lying in the first differential amplifier circuit 401, the input PMOS 43 lying in the second differential amplifier circuit 402, and the input PMOSs 431 and 432 lying in the third differential amplifier circuit 40-3 may be controlled.

The first differential amplifier circuit 401 may amplify the difference between the first input voltage V1 and the output voltage Vout and may cause its output current to flow into the first output node N11. In the second differential amplifier circuit 402, the difference between the second input voltage V2 and the output voltage Vout may be amplified and its output current may flow into the first output node N11. Further, the third differential amplifier circuit 403 may amplify the difference between the third input voltage V3 and the output voltage Vout and may allow its output current to flow into the first output node N11. In doing so, the output currents of the first, second and third differential amplifier circuits 401, 402 and 403 may be added together on the first output node N11. This added current may be converted to its corresponding control voltage MNOG by the load circuit 50 and hence the conduction state of the output NMOS 62 may be controlled by the control voltage MNOG. Thus, the average value (V2+V3)/2 of the second input voltage V2 and the third input voltage V3 may be outputted from the output terminal OUT as an output voltage Vout.

In first exemplary embodiment of the multi-input operational amplifier circuit 30, the constant current source of the third differential amplifier circuit 403 that supplies the doubled constant current i×2 with respect to the constant current sources of the first differential amplifier circuits 401 and 402 may utilize the PMOS 41 of the same number and size owing to the use of two types of bias voltages PBS1 and PBS2. A conventional circuit may require connecting the two constant current source PMOSs 41 in parallel in the third differential amplifier circuit 403 and may therefore require four PMOSs 41 in total (including the two constant current source PMOSs 41 in the first and second differential amplifier circuits 401 and 402). In contrast, since equivalent operations may be implemented by the three constant current source PMOSs 41 of the first exemplary embodiment, the present invention may allow a smaller chip area to be utilized while maintaining the same capabilities as conventional devices. Thus, the multi-input operational amplifier circuit 30 of the first exemplary embodiment may be utilized in a D/A converter operable with a high degree of accuracy and having a small area. In addition, by providing one bias circuit for each driver IC, several transistors can be reduced or cut down by respective 720ch, for example, and a driver IC smaller in area may be constructed. Further, with the provision of the second selection circuit 20c, N voltages to be outputted to the multi-input operational amplifier circuit 30 may be selected corresponding to digital data of lower n bits. It may be possible to parallel-connect the differential amplifier circuits 401 through 403 with differing constant currents.

Second Exemplary Embodiment

Figure 5:
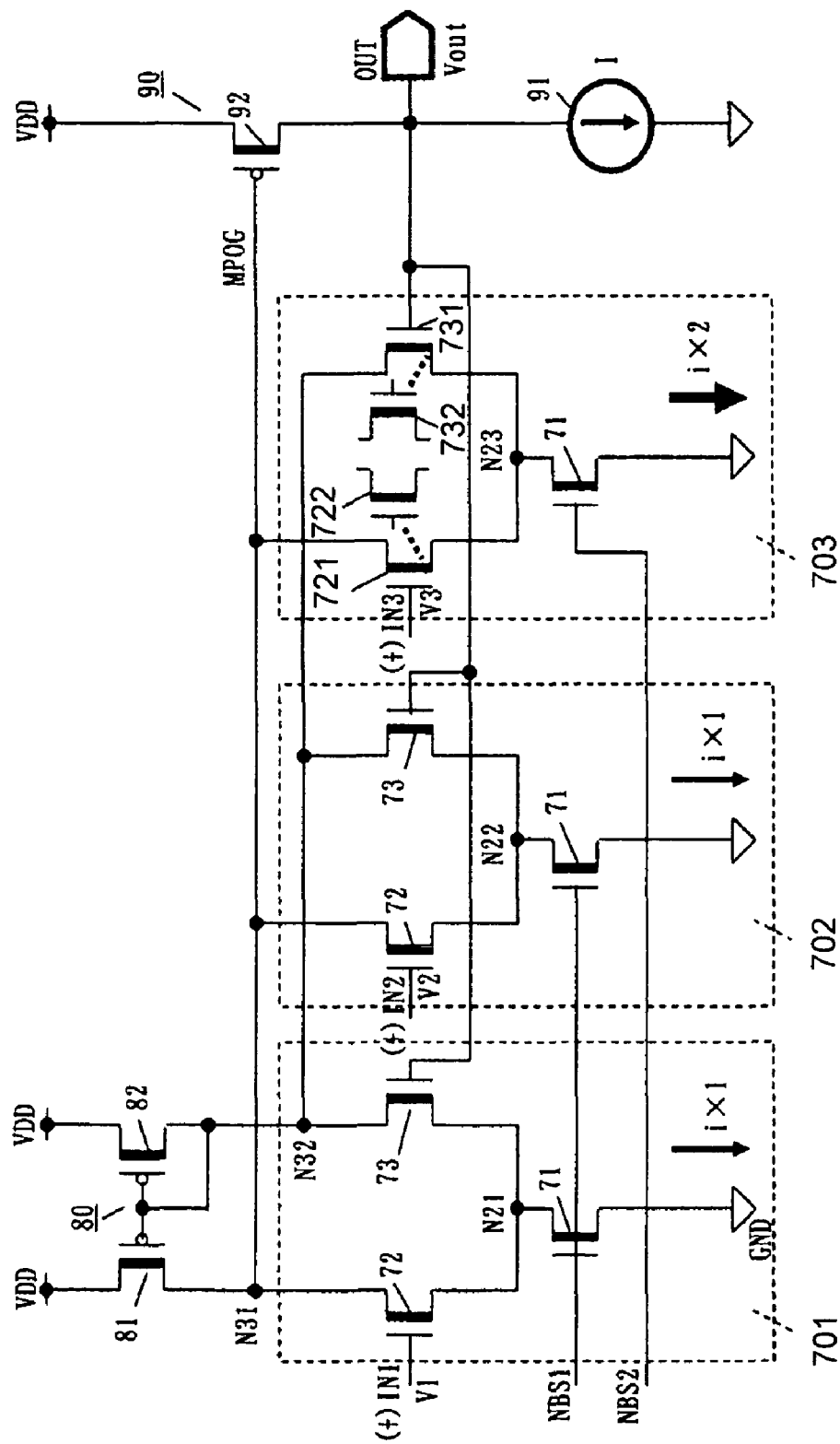
FIG. 5 is a schematic diagram of a second exemplary embodiment of a multi-input operational amplifier circuit according to the present invention.

FIG. 5 depicts a second exemplary embodiment of a multi-input operational amplifier circuit according to the present invention. The multi-input operational amplifier circuit corresponds to the multi-input operational amplifier circuit 30 of the first exemplary embodiment and is of a circuit for the source, which comprises a voltage follower circuit of n bit (2 bits, for example) decoders. In a manner similar to the first exemplary embodiment, the multi-input operational amplifier circuit of the second exemplary embodiment may include a plurality of differential stages (first, second and third differential amplifier circuits, for example) 701 through 703, a load circuit 80 connected in common to the first, second and third differential amplifier circuits 701 through 703, and an output stage (output circuit, for example) 90 connected to the differential amplifier circuits 701 through 703 and load circuit 80.

Of the first, second and third differential amplifier circuits 701 through 703, the first differential amplifier circuit 701 may include a positive-phase input terminal (+) IN1 to which a first input voltage (fixed "H", for example) may be inputted, a first common node N21 which may cause a constant current i×1 (i=1 mA, for example) to flow therethrough, a first output node N31 which may output a control voltage MPOG, and a second output node N32 complementary to the first output node N31. The first common node N21 may be connected to a first source or power supply node (ground GND, for example) via a first constant current source (for example, NMOS) 71 which may supply the constant current i×1. The NMOS 71 may cause the constant current i×1 to flow between the drain and source thereof in response to a first bias voltage NBS1 applied to the gate thereof.

A first input transistor (for example, one PMOS) 72 and a second input transistor (for example, one PMOS) 73 that form a differential pair may be branch-connected to the first common node N21. Further, the NMOS 72 may be connected to the first output node N31 and the NMOS 73 may be connected to the second output node N32. The NMOS 72 may always in an ON state by the "H"-fixed input voltage V1 inputted to its gate from the positive-phase input terminal (+) IN1. The NMOS 73 may hold a conduction state controlled by an output voltage Vout inputted to its gate from an output terminal OUT.

The second differential amplifier circuit 702 may have a positive-phase input terminal (+) IN2 to which a second input voltage V2 may be inputted, and a second common node N22 which may cause a constant current i×1 to flow therethrough. In a manner similar to the first differential amplifier circuit 701, the second differential amplifier circuit 702 may include an NMOS 71 for a constant current source and NMOSs 72 and 73 for a differential pair. For example, in the second differential amplifier circuit 702, the second common node N22 may be connected to its corresponding ground GND via the NMOS 71 which may supply the constant current i×1. The NMOS 71 may cause the constant current i×1 to flow between the drain and source thereof in response to the first bias voltage NBS1 applied to its gate. The NMOSs 72 and 73 that form the differential pair may be branch-connected to the second common node N22. Further, the NMOS 72 may be connected to the first output node N31 and the NMOS 73 may be connected to the second output node N32. The NMOS 72 may hold a conduction state controlled by the input voltage V2 inputted to its gate from the positive-phase input terminal (+) IN2. Further, the NMOS 73 may hold a conduction state controlled by the output voltage Vout inputted to its gate from the output terminal OUT.

The third differential amplifier circuit 703 may have a positive-phase input terminal (+) IN3 to which a third input voltage V3 may be inputted, and a third common node N23 that may cause a doubled constant current i×2 (2 mA, for example) to flow therethrough. The third differential amplifier circuit 703 may include an NMOS 71 for a constant current source similar to the first and second differential amplifier circuits 701 and 702, two parallel-connected NMOSs 72-1 and 72-2 for a differential pair, which may be different from the first and second differential amplifier circuits 701 and 702, and two NMOSs 731 and 732 connected in parallel in like manner. For example, in the third differential amplifier circuit 703, the third common node N23 may be connected to its corresponding ground GND via the NMOS 71 which supplies the doubled constant current i×2. The NMOS 71 for the constant current source may cause the doubled constant current i×2 to flow between the drain and source thereof in response to a second bias voltage NBS2 applied to its gate. The two parallel-connected NMOSs 721 and 722 and the two-parallel-connected NMOSs 731 and 732 for forming the differential pairs respectively may be branch-connected to the third common node N23. Further, the NMOSs 721 and 722 may be connected to the first output node N31 and the NMOSs 731 and 732 may be connected to the second output node N32. Each of the NMOSs 721 and 722 may hold a conduction state controlled by the input voltage V3 inputted to its gate from the positive-phase input terminal (+) IN3. Further, each of the NMOSs 731 and 732 holds a conduction state controlled by the output voltage Vout inputted to its gate from the output terminal OUT.

The load circuit 80 may be connected between the first and second output nodes N31 and N32 and a second source or power supply node (VDD node, for example). The load circuit 80 may include a current mirror circuit using two transistors (for example, PMOS) 81 and 82. The load circuit 80 may have the function of converting the current flowing through the first output node N31 to its corresponding control voltage MPOG and outputting the same to the output circuit 90. The drain and source of the PMOS 81 may be connected to the first output node N31 and the VDD node, respectively. The drain and source of the PMOS 82 may be connected to the second output node N32 and the VDD node, respectively. The gate and drain of the PMOS 82 may be connected to the gate of the PMOS 81. The output circuit 90 may be connected to the first output node N31.

The output circuit 90 may have a constant current source 91 comprised of transistors or the like for supplying a constant current I, an output terminal OUT for outputting the output voltage Vout, and an output transistor (for example, PMOS) 92. These components may be connected between the ground GND and the VDD node. The output terminal OUT may be connected in common to the gate of the NMOS 73 in the differential amplifier circuit 701, the gate of the NMOS 73 in the differential amplifier circuit 702, and the gates of the NMOSs 731 and 732 in the differential amplifier circuit 703. The NMOS 92 may be a transistor whose conduction state may be controlled by the control voltage MPOG outputted from the first output node N31 and which may output the amplified output voltage Vout from the output terminal OUT.

In a manner similar to the first exemplary embodiment, the multi-input operational amplifier circuit of the second exemplary embodiment may have the feature that, as compared with a conventional circuit, two types of bias voltages NBS1 and NBS2 for the constant current source may be provided and the second bias voltage NBS2 may be brought to such a potential that causes a constant current i×2 twice as large as the current caused by the first bias voltage NBS1. In other words, the second bias voltage NBS2 may be lower than the first bias voltage NBS1. The first and second bias voltages NBS1 and NBS2 may be supplied from the bias circuit shown in FIG. 4, for example.

In the multi-input operational amplifier circuit of the second exemplary embodiment, the first, second and third input voltages V1, V2 and V3 outputted from the selector 20 shown in FIG. 1 may be respectively supplied to the positive-phase input terminals (+) IN1, (+) IN2 and (+) IN3 of the first, second and third differential amplifier circuits 701, 702 and 703. Further, the first bias voltage NBS1 may be supplied to the gate of the current source NMOS 71 lying in the first differential amplifier circuit 701 and the gate of the current source NMOS 71 lying in the second differential amplifier circuit 702. The second bias voltage NBS2 may be supplied to the gate of the current source NMOS 71 lying in the third differential amplifier circuit 703. In doing so, the current source NMOS 71 in the first differential amplifier circuit 701 may be activated and the input NMOS 72 thereof may be brought to an ON state. At the same time, the current source NMOS 71 in the second differential amplifier circuit 702 may be activated and the conduction state of the input NMOS 72 may be controlled by the input voltage V2. Further, in the third differential amplifier circuit 703, the current source NMOS 71 may be activated and the conduction states of the input NMOSs 721 and 722 may be controlled by the input voltage V3.

When the current flows into the load circuit 80, it may be converted to a control voltage MPOG, which may appear on the first output node N31. The conduction state of the output PMOS 92 may be controlled by the control voltage MPOG, so that a constant current I may be supplied to the PMOS 92 from the constant current source 91. Thus, an output voltage Vout may appear at the output terminal OUT. In doing so, the conduction states of the input NMOS 73 lying in the first differential amplifier circuit 701, the input NMOS 73 lying in the second differential amplifier circuit 702, and the input NMOSs 731 and 732 lying in the third differential amplifier circuit 70-3 may be controlled.

The first differential amplifier circuit 701 may amplify the difference between the first input voltage V1 and the output voltage Vout and may cause its output current to flow into the first output node N31. In the second differential amplifier circuit 702, the difference between the second input voltage V2 and the output voltage Vout may be amplified and its output current may flow into the first output node N31. Further, the third differential amplifier circuit 703 may amplify the difference between the third input voltage V3 and the output voltage Vout and may allow its output current to flow into the first output node N31. In doing so, the output currents of the first, second and third differential amplifier circuits 701, 702 and 703 may be added together on the first output node N31. This added current may be converted to its corresponding control voltage MPOG by the load circuit 80 and, hence, the conduction state of the output PMOS 92 may be controlled by the control voltage MPOG. Thus, the average value (V2+V3)/2 of the second input voltage V2 and the third input voltage V3 may be outputted from the output terminal OUT as an output voltage Vout.

In a multi-input operational amplifier circuit according to the second exemplary embodiment, the constant current source of the third differential amplifier circuit 703 that supplies the doubled constant current i×2 with respect to the constant current sources of the first differential amplifier circuits 701 and 702 may utilize the NMOS 71 of the same number and size owing to the provision of the two types of bias voltages NBS1 and NBS2. The conventional circuit may require connecting the two constant current source NMOSs 71 in parallel in the third differential amplifier circuit 703 and may therefore require four NMOSs 71 in total (including the two constant current source NMOSs 71 in the first and second differential amplifier circuits 701 and 702). On the other hand, since equivalent operations may be performed by the three constant current source NMOSs 71 in the second exemplary embodiment, a smaller chip area may be utilized while maintaining the same capabilities as conventional devices. Accordingly, a multi-input operational amplifier circuit accordingly to the second exemplary embodiment may enable a D/A converter operable with a high degree of accuracy and having a small area.

Third Exemplary Embodiment

Figure 6:
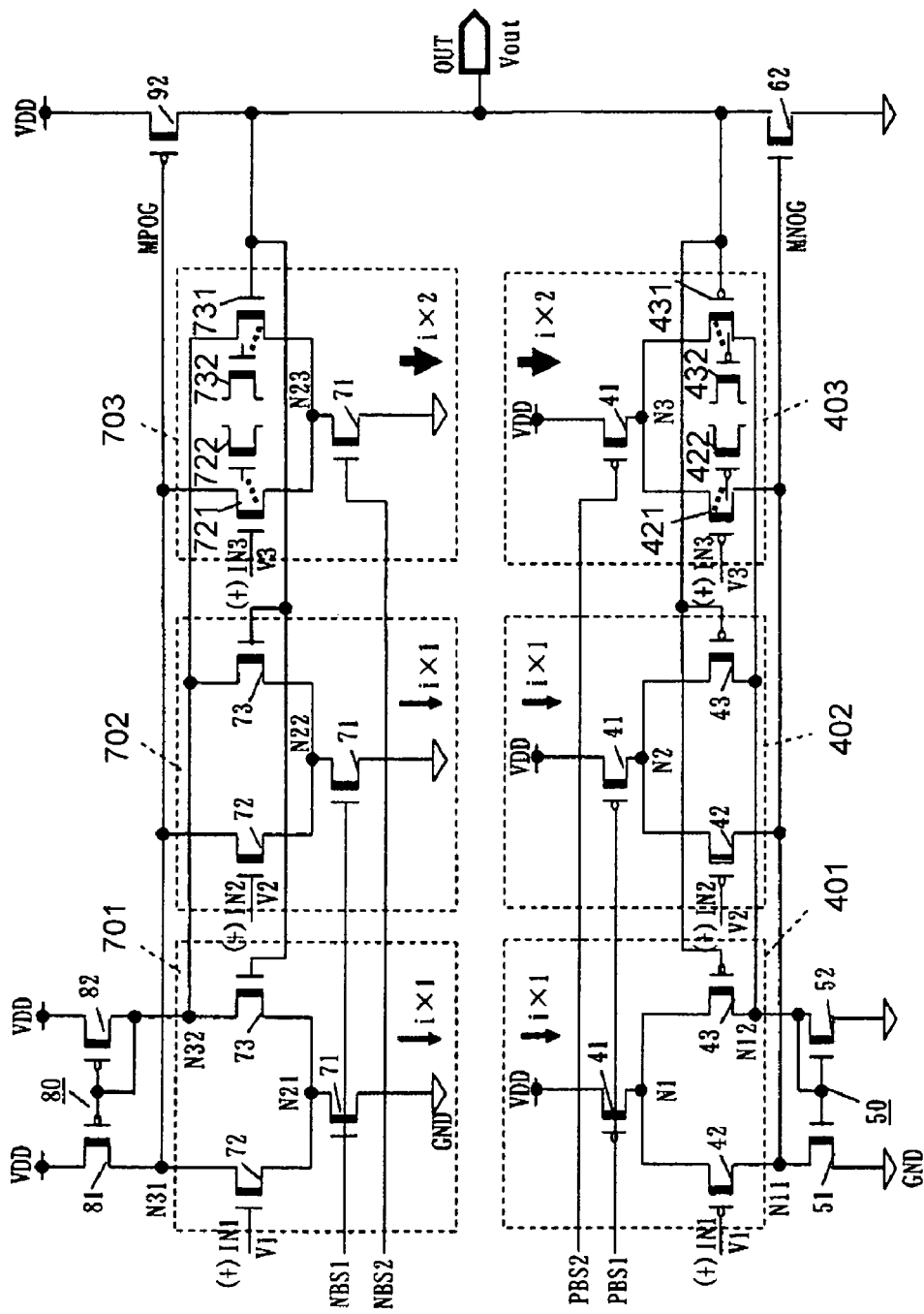
FIG. 6 is a schematic diagram of a third exemplary embodiment of a multi-input operational amplifier circuit according to the present invention.

Referring to FIG. 6, an exemplary multi-input operational amplifier circuit of a rail-to-rail type is shown, in which a multi-input operational amplifier circuit for the sink according to the first exemplary embodiment and a multi-input operational amplifier circuit for the source according to the second exemplary embodiment are utilized in combination. When a source voltage VDD (15V, for example) is applied, the multi-input operational amplifier circuit may determine an average value (V2+V3)/2 (=Vout) of input voltages V2 and V3 in a voltage range from 0V to VDD and may output the output voltage Vout from an output terminal OUT.

In an exemplary multi-input operational amplifier circuit according to the third exemplary embodiment, the multi-input operational amplifier circuit for the sink may be operated when the input voltages V2 and V3 change in a voltage range from 0V to VDD/2 and when the input voltages V2 and V3 change in a voltage range from VDFD/2 to VDD, the multi-input operational amplifier circuit for the source may be operated. Therefore, the operational precision of the device may be enhanced.

In an exemplary multi-input operational amplifier circuit according to the third exemplary embodiment, the constant current source PMOS 41/constant current source NMOS 71 may be respectively provided with the two types of bias voltages PBS1, PBS2/NBS1, NBS2. The constant current sources of the third differential amplifier circuits 403 and 703 that supply the doubled constant current i×2 may utilize the PMOS 41 and NMOS 71 of the same number and size. Therefore, a conventional circuit may require eight constant-current source transistors (PMOS: four and NMOS: four). Since, however, the equivalent operations may be implemented by the six constant current source transistors (PMOS: three and NMOS: three) in the third exemplary embodiment, an smaller chip area may be required while maintaining the same capabilities as conventional devices. Accordingly, a multi-input operational amplifier circuit accordingly to the second exemplary embodiment may enable a D/A converter operable with a high degree of accuracy and having a small area.

Fourth Exemplary Embodiment

The fourth exemplary embodiment relates to a driver for a display device and may be a D/A converter for converting digital data of m+n bits (where n is an integer greater than or equal to 3) to analog data. The exemplary embodiment may include a reference voltage generating circuit or generator (reference voltage generator 10 shown in FIG. 3, for example) which may generate gradation or gray level voltages corresponding to m bits, first selection circuits (first selection circuits 20a and 20b shown in FIG. 3, for example) which may select two gradation voltages from the reference voltage generator, based on the m-bit digital data, a second selection circuit (second selection circuit 20c shown in FIG. 3, for example) which may output either of the two gradation voltages selected by the first selection circuits, as analog data of n outputs, based on digital data of n bits, and a multi-input operational amplifier circuit (multi-input operational amplifier circuit shown in FIG. 1, 5 or 6, for example) which may input the n analog data therein, assign weights thereto according to the respective bits, and output an average value thereof.

Figure 7:
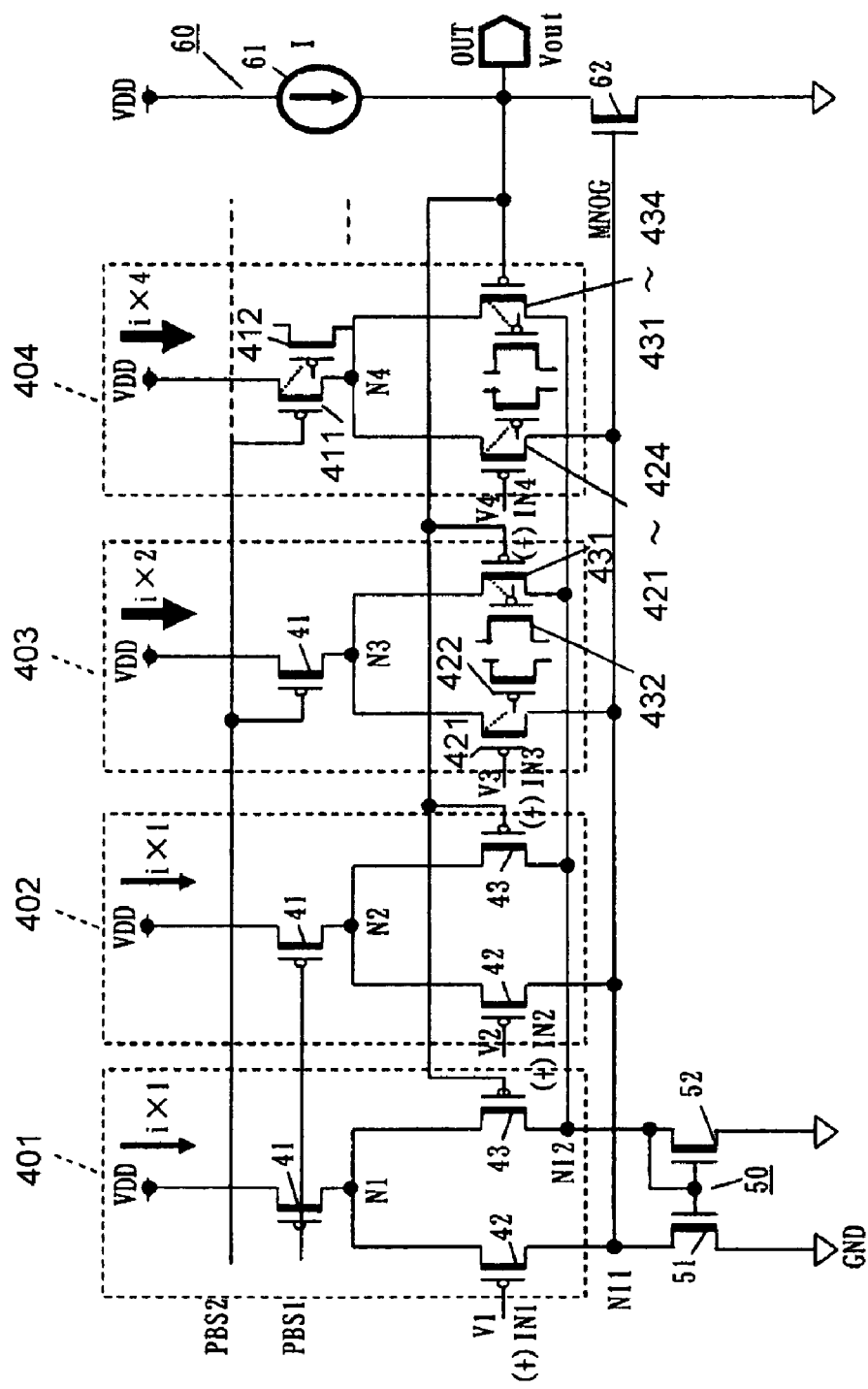
FIG. 7 is a schematic diagram of a fourth exemplary embodiment of a multi-input operational amplifier circuit according to the present invention.

An exemplary multi-input operational amplifier circuit of n bit decoders (where n: positive integer, e.g., 3) will be described. Referring to FIG. 7, an exemplary multi-input operational amplifier circuit may include a sink, which is made up of a voltage follower circuit of 3 bit decoders. It may include first, second, third, and fourth differential amplifier circuits 401 through 404, a load circuit 50 connected in common to the first, second, third, and fourth differential amplifier circuits 401 through 404, and an output circuit 60 connected to the differential amplifier circuits 401 through 404 and load circuit 50. The first, second, and third differential amplifier circuits 401 through 403 may be similar to those employed in the first exemplary embodiment.

The fourth differential amplifier circuit 404 may include a positive-phase input terminal (+) IN4 to which a fourth input voltage V4 may be inputted and a fourth common node N4 which may cause a quadruple constant current i×4 (i=4 mA, for example) to flow therethrough. The fourth differential amplifier circuit 404 may include two parallel-connected PMOSs 411 and 412 for constant current sources different from the first and second differential amplifier circuits 401 and 402, four parallel-connected PMOSs 421 through 424 for differential pairs different from the first and second differential amplifier circuits 401 and 402, and four PMOSs 431 through 434 connected in parallel in like manner.

When a source voltage VDD is applied, the multi-input operational amplifier circuit of the fourth exemplary embodiment may determine an average value (V1+V2+V3+V4)/4 (=Vout) of input voltages V1, V2, V3, and V4 in a voltage range from 0V to VDD/2 and may output the output voltage Vout from an output terminal OUT.

Although eight constant current source PMOSs were required in conventional devices in the case of the 3 bit decoders, equivalent operations can be realized using five PMOSs 41, 411, and 412 for the constant current sources in the fourth exemplary embodiment. Therefore, a smaller chip area may be required while maintaining the capabilities of the conventional devices.

A 3 bit decoder configuration like the fourth exemplary embodiment may be utilized in the source of the second exemplary embodiment and in the rail-to-rail type circuit according to the third exemplary embodiment. The rail-to-rail type multi-input operational amplifier circuit of 3 bit decoders may be capable of performing operations with ten constant current source transistors (PMOS: five and NMOS: five) equivalent to those performed by sixteen constant current source transistors (PMOS: eight and NMOS: eight) in conventional devices. Therefore, it may be possible to produce a device having a smaller chip area.

If it is desired to set the embodiment of FIG. 7 to a 4 bit decoder configuration, a fifth differential amplifier circuit may be provided alongside the fourth differential amplifier circuit 404. The fifth differential amplifier circuit may include, for example, a positive-phase input terminal inputted with a fourth input voltage and a fifth common node for allowing an octuple constant current i×8 to flow therethrough and may include three parallel-connected PMOSs for constant current sources gate-controlled by the bias voltage PBS2, eight parallel-connected PMOSs of one of a differential pair, and eight parallel-connected PMOSs of the other thereof.

Fifth Exemplary Embodiment

The multi-input operational amplifier circuit of the fourth exemplary embodiment may include, for example, a first differential amplifier circuit which may output a first voltage, based on a first constant current source based on a first bias voltage, and a first input voltage, an n+1th differential amplifier circuit which may be provided in parallel with the first differential amplifier circuit and which may output an n+1th voltage, based on a second constant current source based on a second bias voltage, and analog data corresponding to the most significant bit of lower n bits, and a differential amplifier circuit group which may include a plurality of differential amplifier circuits which may be provided in parallel with the first differential amplifier circuit and each of which may be provided with a constant current source for outputting current, different from an n+1th constant current source, and may output each voltage, based on analog data corresponding to each of the lower n−1 bits. The voltages inputted to the respective differential amplifier circuits may correspond to either of the selected two gradation voltages. The average value of voltages outputted from the respective differential amplifier circuits may be outputted.

Figure 8:
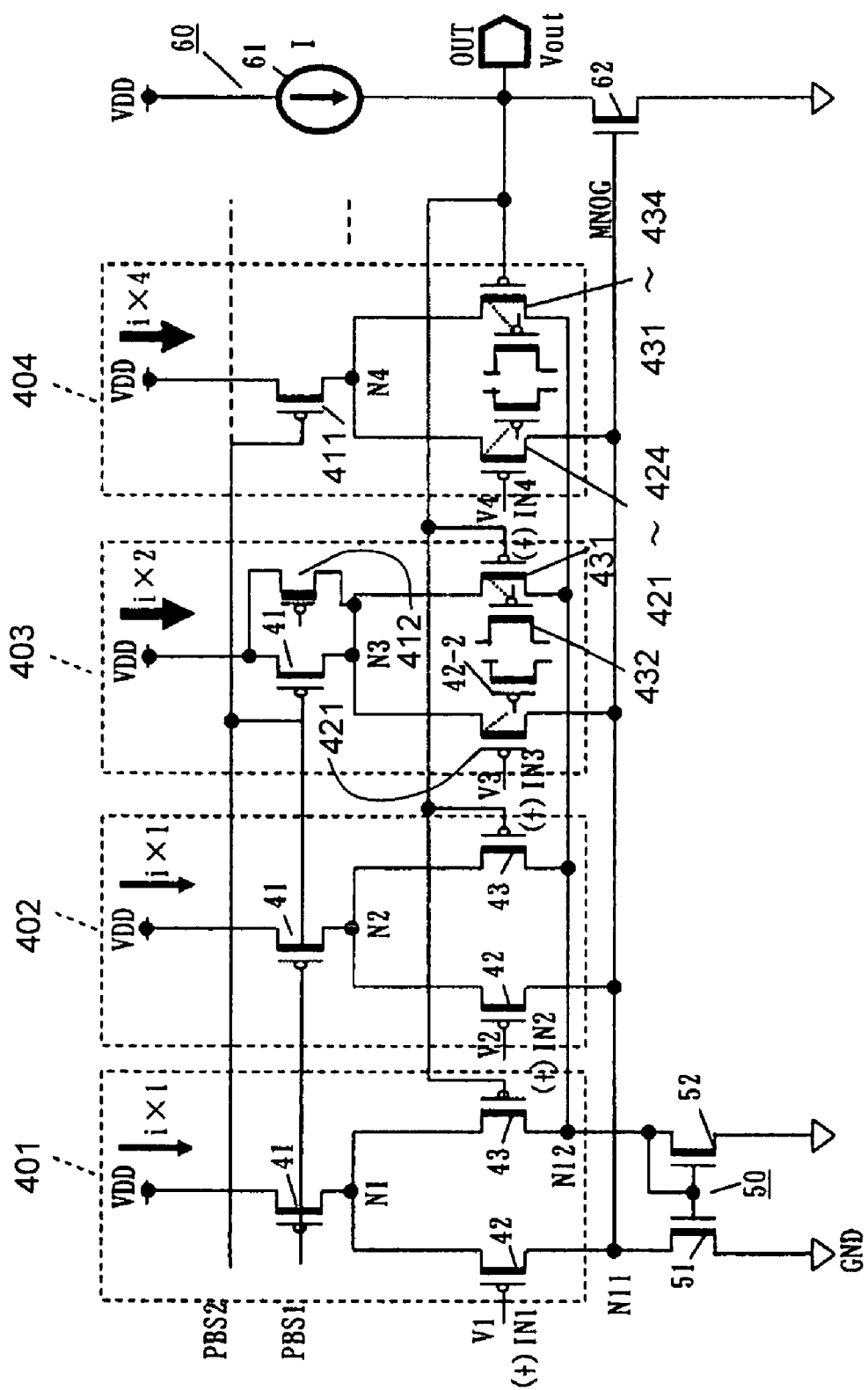
FIG. 8 is a schematic diagram of a fifth exemplary embodiment of a multi-input operational amplifier circuit according to the present invention.

Referring to FIG. 8, in a multi-input operational amplifier circuit according to a fifth exemplary embodiment, the differential amplifier circuit 404 corresponding to the most significant bit of lower n bits may be implemented or achieved based on a bias voltage PBS2 different from a bias voltage PBS1. Thus, the device may require a chip area similar to the fourth exemplary embodiment.

Modifications

The present invention is not limited to the first through fifth exemplary embodiments; various forms and modifications are possible. For example, in the first differential amplifier circuits 101 and 401 shown in FIGS. 1, 5, 6, 7 and 8, a varying input voltage V1 other than the fixed input voltage V1 may be inputted to the first input terminal IN1. Thus, operative effects substantially similar to the first through fifth exemplary embodiments may be obtained. Further, various forms and modifications are possible when, for example, the differential amplifier circuits 401 through 404 and 701 through 703, load circuits 50 and 80, and output circuits 60 and 90 are comprised of other transistors, and the load circuits 50 and 80 are made up of resistive elements or the like. In addition, a D/A converter according to each exemplary embodiment may be utilized in other application, such as in conjunction with display device other than an LCD, in a semiconductor device, and in other applications apparent to those of skill in the art.

While exemplary embodiments of the invention have been set forth above for the purpose of disclosure, modifications of the disclosed embodiments of the invention as well as other embodiments thereof may occur to those skilled in the art. Accordingly, it is to be understood that the inventions contained herein are not limited to the above precise embodiments and that changes may be made without departing from the spirit or the scope of the invention. Likewise, it is to be understood that it is not necessary to meet any or all of the stated advantages or objects of the invention disclosed herein to fall within the scope of the invention, since inherent and/or unforeseen advantages of the present invention may exist even though they may not have been explicitly discussed herein. The scope of the invention is to be determined solely by the following claims.

What is claimed is:

1. A multi-input operational amplifier circuit comprising:
an output terminal adapted to output an average value of a second input voltage and N−1 third inputs, where N is an integer greater than or equal to 2, the average value being supplied to the output terminal as an output voltage;
a first differential amplifier circuit including
a first constant current source connected between a first source node and a first common node, the first constant current source being adapted to receive a first bias voltage and supply a first constant current to the first common node based on the first bias voltage,
a first input transistor connected between the first common node and a first output node, the first input transistor adapted to receive a first input voltage, a conduction state of the first input transistor being controlled by the first input voltage, and
a second input transistor connected between the first common node and a second output node, the second input transistor being adapted to receive the output voltage, a conduction state of the second input transistor being controlled by the output voltage;
a second differential amplifier circuit including a second constant current source connected between the first source node and a second common node, the second constant current source being adapted to receive the first bias voltage and supply a second constant current to the second common node based on the first bias voltage,
a third input transistor connected between the second common node and the first output node, the third input transistor being adapted to receive the second input voltage, a conduction state of the third input transistor being controlled by the second input voltage, and
a fourth input transistor connected between the second common node and the second output node, the fourth input transistor adapted to receive the output voltage, a conduction state of the forth input transistor being controlled by the output voltage; N−1 third differential amplifier circuits, each of the third differential amplifier circuits including
a third constant current source connected between the first source node and a third common node, the third constant current source being adapted to receive a second bias voltage obtained by assigning a weight to the first bias voltage and supply a third constant current to the third common node based on the second bias voltage,
a fifth input transistor connected between the third common node and the first output node, the fifth input transistor being adapted to receive a third input voltage therein, a conduction state of the fifth input transistor being controlled by the third input voltage, and
a sixth input transistor connected between the third common node and the second output node, the sixth input transistor being adapted to receive the output voltage, a conduction state of the sixth input transistor being controlled by the output voltage;
a first load circuit connected between the first and second output nodes and a second source node; and
a first output transistor connected between the second source node and the output terminal, a conduction of the first output transistor state being controlled by a voltage on the first output node.

2. The multi-input operational amplifier circuit of claim 1, further comprising
a fourth differential amplifier circuit including
a fourth constant current source connected between a second source node and a fourth common node, the fourth constant current source adapted to receive a third bias voltage and supply a fourth constant current to the fourth common node based on the fourth bias voltage,
a seventh input transistor connected between the fourth common node and a third output node, the fourth input transistor adapted to receive the first input voltage, a conduction state of the fourth input transistor being controlled by the first input voltage, and
an eighth input transistor connected between the fourth common node and a fourth output node, the second input transistor being adapted to receive the output voltage, a conduction state of the eighth input transistor being controlled by the output voltage;
a fifth differential amplifier circuit including
a fifth constant current source connected between the second source node and a fifth common node, the fifth constant current source adapted to receive the fourth bias voltage and supply a second constant current to the second common node based on the fourth bias voltage,
a ninth input transistor connected between the fifth common node and the third output node, the ninth input transistor being adapted to receive the second input voltage, a conduction state of the ninth input transistor being controlled by the second input voltage, and a tenth input transistor connected between the fifth common node and the fourth output node, the tenth input transistor adapted to receive the output voltage, a conduction state of the tenth input transistor being controlled by the output voltage;

N−1 sixth differential amplifier circuits, each of the sixth differential amplifier circuits including a sixth constant current source connected between the second source node and a sixth common node, the sixth constant current source being adapted to receive a fourth bias voltage obtained by assigning a weight to the third bias voltage and supply a sixth constant current to the sixth common node based on the fourth bias voltage, an eleventh input transistor connected between the sixth common node and the third output node, the eleventh input transistor'being adapted to receive the third input voltage therein, a conduction state of the fifth input transistor being controlled by the third input voltage, and a twelfth input transistor connected between the sixth common node and the fourth output node, the twelfth input transistor being adapted to receive the output voltage, a conduction state of the twelfth input transistor being controlled by the output voltage;

a second load circuit connected between the third and fourth output nodes and the first source node; and a second output transistor connected between the first source node and the output terminal, a conduction state of the second output transistor being controlled by a voltage on the third output node;

wherein the multi-input operational amplifier circuit has a rail-to-rail configuration.

3. A digital/analog converter comprising:

a reference voltage generator which generates a plurality of reference voltages;

a selector adapted to receive the reference voltages and select a first input voltage, a second input voltage, and N−1 third input voltages, where N is an integer greater than or equal to 2, based on digital data including a plurality of bits; and a multi-input operational amplifier circuit including an output terminal adapted to output an average value of a second input voltage and N−1 third input, the average value being supplied to the output terminal as an output voltage;

a first differential amplifier circuit including a first constant current source connected between a first source node and a first common node, the first constant current source adapted to receive a first bias voltage and supply a first constant current to the first common node based on the first bias voltage, a first input transistor connected between the first common node and a first output node, the first input transistor adapted to receive a first input voltage, a conduction state of the first input transistor being controlled by the first input voltage, and a second input transistor connected between the first common node and a second output node, the second input transistor being adapted to receive the output voltage, a conduction state of the second input transistor being controlled by the output voltage;

a second differential amplifier circuit including a second constant current source connected between the first source node and a second common node, the second constant current source adapted to receive the first bias voltage and supply a second constant current to the second common node based on the first bias voltage, a third input transistor connected between the second common node and the first output node, the third input transistor being adapted to receive the second input voltage, a conduction state of the third input transistor being controlled by the second input voltage, and a fourth input transistor connected between the second common node and the second output node, the fourth input transistor adapted to receive the output voltage, a conduction state of the forth input transistor being controlled by the output voltage;

N−1 third differential amplifier circuits, each of the third differential amplifier circuits including a third constant current source connected between the first source node and a third common node, the third constant current source being adapted to receive a second bias voltage obtained by assigning a weight to the first bias voltage and supply a third constant current to the third common node based on the second bias voltage, a fifth input transistor connected between the third common node and the first output node, the fifth input transistor being adapted to receive a third input voltage therein, a conduction state of the fifth input transistor being controlled by the third input voltage, and a sixth input transistor connected between the third common node and the second output node, the sixth input transistor being adapted to receive the output voltage, a conduction state of the sixth input transistor being controlled by the output voltage;

a first load circuit connected between the first and second output nodes and a second source node; and a first output transistor connected between the second source node and the output terminal, a conduction of the first output transistor state being controlled by a voltage on the first output node.

4. The digital/analog converter of claim 3, further comprising a fourth differential amplifier circuit including a fourth constant current source connected between a second source node and a fourth common node, the fourth constant current source adapted to receive a third bias voltage and supply a fourth constant current to the fourth common node based on the fourth bias voltage, a seventh input transistor connected between the fourth common node and a third output node, the fourth input transistor adapted to receive the first input voltage, a conduction state of the fourth input transistor being controlled by the first input voltage, and an eighth input transistor connected between the fourth common node and a fourth output node, the second input transistor being adapted to receive the output voltage, a conduction state of the eighth input transistor being controlled by the output voltage;

a fifth differential amplifier circuit including a fifth constant current source connected between the second source node and a fifth common node, the fifth constant current source adapted to receive the fourth bias voltage and supply a second constant current to the second common node based on the fourth bias voltage, a ninth input transistor connected between the fifth common node and the third output node, the ninth input transistor being adapted to receive the second input voltage, a conduction state of the ninth input transistor being controlled by the second input voltage, and a tenth input transistor connected between the fifth common node and the fourth output node, the tenth input transistor adapted to receive the output voltage, a conduction state of the tenth input transistor being controlled by the output voltage;

N−1 sixth differential amplifier circuits, each of the sixth differential amplifier circuits including a sixth constant current source connected between the second source node and a sixth common node, the sixth constant current source being adapted to receive a fourth bias voltage obtained by assigning a weight to the third bias voltage and supply a sixth constant current to the sixth common node based on the fourth bias voltage, an eleventh input transistor connected between the sixth common node and the third output node, the eleventh input transistor being adapted to receive the third input voltage therein, a conduction state of the fifth input transistor being controlled by the third input voltage, and a twelfth input transistor connected between the sixth common node and the fourth output node, the twelfth input transistor being adapted to receive the output voltage, a conduction state of the twelfth input transistor being controlled by the output voltage;

a second load circuit connected between the third and fourth output nodes and the first source node; and a second output transistor connected between the first source node and the output terminal, a conduction state of the second output transistor being controlled by a voltage on the third output node;

wherein the multi-input operational amplifier circuit has a rail-to-rail type configuration.

5. A driver suitable for use in a display device including a digital/analog converter for converting digital data of m+n bits, where n is an integer greater than or equal to 3 and m is a positive integer, to analog data, comprising:

a reference voltage generator adapted to generate a plurality of gradation voltages corresponding to m bits;

a first selection circuit adapted to select two of the gradation voltages from the reference voltage generator, based on the digital data of m bits;

a second selection circuit adapted to output one of the two gradation voltages selected by the first selection circuit as analog data of respective n outputs, based on digital data of n bits; and a multi-input operational amplifier circuit adapted to receive the analog data, assign respective weights thereto according to the respective bits, and output an average value thereof; wherein the multi-input operational amplifier circuit comprises:

a first differential amplifier circuit adapted to output a first voltage, based on a first constant current source based on a first bias voltage, and a first input voltage;

a second differential amplifier circuit connected in parallel with the first differential amplifier circuit adapted to output a second voltage, based on the first constant current source based on the first bias voltage, and a second input voltage;

a third differential amplifier circuit connected in parallel with the first differential amplifier circuit adapted to output a third voltage, based on a second constant current source based on a second bias voltage, and a third input voltage; and a fourth differential amplifier circuit connected in parallel with the first differential amplifier circuit adapted to output a fourth voltage, based on a third constant current source based on the second bias voltage, and a fourth input voltage;

wherein the first through fourth input voltages correspond to one of the selected two gradation voltages; and wherein the driver outputs an average value of the first through fourth input voltages.

6. A driver suitable for use in a display device including a digital/analog converter for converting digital data of m+n bits, where n is an integer greater than or equal to 3 and m is a positive integer, to analog data, comprising:

a reference voltage generator adapted to generate a plurality of gradation voltages corresponding to m bits;

a first selection circuit adapted to select two of the gradation voltages from the reference voltage generator, based on the digital data of m bits;

a second selection circuit adapted to output one of the two gradation voltages selected by the first selection circuit as analog data of respective n outputs, based on digital data of n bits; and a multi-input operational amplifier circuit adapted to receive the analog data and output an average value thereof;

wherein the multi-input operational amplifier circuit comprises:

a first differential amplifier circuit adapted to output a first voltage, based on a first constant current source based on a first bias voltage, and a first input voltage;

a second differential amplifier circuit connected in parallel with the first differential amplifier circuit adapted to output a second voltage, based on the first constant current source based on the first bias voltage, and a second input voltage;

a third differential amplifier circuit connected in parallel with the first differential amplifier circuit adapted to output a third voltage, based on a second constant current source based on the first bias voltage, and a third input voltage; and a fourth differential amplifier circuit connected in parallel with the first differential amplifier circuit adapted to output a fourth voltage, based on a third constant current source based on a second bias voltage, and a fourth input voltage;

wherein the first through fourth input voltages correspond to one of the selected two gradation voltages; and wherein the driver outputs an average value of the first through fourth input voltages.

7. A driver suitable for use in a display device including a digital/analog converter for converting digital data of m+n bits, where n is an integer greater than or equal to 3 and m is a positive integer, to analog data, comprising:

a reference voltage generator adapted to generate a plurality of gradation voltages corresponding to in bits;

a first selection circuit adapted to select two of the gradation voltages from the reference voltage generator, based on the digital data of m bits;

a second selection circuit adapted to output one of the two gradation voltages selected by the first selection circuit as analog data of respective n outputs, based on digital data of n bits; and a multi-input operational amplifier circuit adapted to receive the analog data and output an average value thereof; wherein the multi-input operational amplifier circuit comprises:

a first differential amplifier circuit adapted to output a first voltage, based on a first constant current source based on a first bias voltage, and a first input voltage;

an n+1th differential amplifier circuit connected in parallel with the first differential amplifier circuit adapted to output an n+1th voltage, based on a second constant current source based on a second bias voltage, and analog data corresponding to the most significant bit of lower n bits; and a differential amplifier circuit group comprising a plurality of differential amplifier circuits each of which is connected in parallel with the first differential amplifier circuit and includes a constant current source for outputting a current, different from an n+1th constant current source and each of which outputs each voltage, based on analog data corresponding to each of the lower n−1 bits;

wherein the voltages inputted to the respective differential amplifier circuits correspond to one of the selected two gradation voltages;

wherein the driver outputs an average value of the voltages outputted from the respective differential amplifier circuits; and wherein n is a positive integer.

8. A driver suitable for use in a display device including a digital/analog converter for converting digital data of m+n bits, where n is an integer greater than or equal to 3 and m is a positive integer, to analog data, comprising:

a reference voltage generator adapted to generate a plurality of gradation voltages corresponding to m bits;

a first selection circuit adapted to select two of the gradation voltages from the reference voltage generator, based on the digital data of m bits;

a second selection circuit adapted to output one of the two gradation voltages selected by the first selection circuit as analog data of respective n outputs, based on digital data of n bits; and a multi-input operational amplifier circuit adapted to receive the analog data and output an average value thereof;

wherein the multi-input operational amplifier circuit comprises:

a first differential amplifier circuit adapted to output a first voltage, based on a first constant current source based on a first bias voltage, and a first input voltage;

a second differential amplifier circuit connected in parallel with the first differential amplifier circuit adapted to output a second voltage, based on the first constant current source based on the first bias voltage, and a second input voltage;

a third differential amplifier circuit connected in parallel with the first differential amplifier circuit adapted to output a third voltage, based on a second constant current source based on a second bias voltage, and a third input voltage; and a fourth differential amplifier circuit connected in parallel with the first differential amplifier circuit adapted to output a fourth voltage, based on a third constant current source based on the second bias voltage, and a fourth input voltage;

wherein the first through fourth input voltages correspond to one of the selected two gradation voltages; and wherein the driver outputs an average value of the first through fourth input voltages.

9. A driver suitable for use in a display device including a digital/analog converter for converting digital data of m+n bits, where n is an integer greater than or equal to 3 and m is a positive integer, to analog data, comprising:

a reference voltage generator adapted to generate a plurality of gradation voltages corresponding to m bits;

a first selection circuit adapted to select two of the gradation voltages from the reference voltage generator, based on the digital data of m bits;

a second selection circuit adapted to output one of the two gradation voltages selected by the first selection circuit as analog data of respective n outputs, based on digital data of n bits; and a multi-input operational amplifier circuit adapted to receive the analog data and assign respective weights thereto according to the respective bits;

wherein the multi-input operational amplifier circuit comprises:

a first differential amplifier circuit adapted to output a first voltage, based on a first constant current source based on a first bias voltage, and a first input voltage;

an n+1th differential amplifier circuit connected in parallel with the first differential amplifier circuit adapted to output an n+1th voltage, based on a second constant current source based on a second bias voltage, and analog data corresponding to the most significant bit of lower n bits; and a differential amplifier circuit group comprising a plurality of differential amplifier circuits each of which is connected in parallel with the first differential amplifier circuit and includes a constant current source for outputting a current, different from an n+1 th constant current source and each of which outputs each voltage, based on analog data corresponding to each of the lower n−1 bits;

wherein the voltages inputted to the respective differential amplifier circuits correspond to one of the selected two gradation voltages;

wherein the driver outputs an average value of the voltages outputted from the respective differential amplifier circuits; and wherein n is a positive integer.

* * * * *